(12) United States Patent
Kataoka et al.

(10) Patent No.: US 9,972,679 B2
(45) Date of Patent: May 15, 2018

(54) SEMICONDUCTOR DEVICE

(71) Applicant: RENESAS ELECTRONICS CORPORATION, Kawasaki-shi, Kanagawa (JP)

(72) Inventors: Hajime Kataoka, Kanagawa (JP); Tatsuya Shiromoto, Kanagawa (JP); Tetsuya Nitta, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days. days.

(21) Appl. No.: 14/620,401

(22) Filed: Feb. 12, 2015

(65) Prior Publication Data

US 2015/0249126 A1   Sep. 3, 2015

(30) Foreign Application Priority Data

Mar. 3, 2014 (JP) .................................. 2014-040989

(51) Int. Cl.
*H01L 29/00* (2006.01)
*H01L 29/06* (2006.01)
(Continued)

(52) U.S. Cl.
CPC ........ *H01L 29/0653* (2013.01); *H01L 21/761* (2013.01); *H01L 21/764* (2013.01);
(Continued)

(58) Field of Classification Search
CPC ........ H01L 29/0696; H01L 29/0843–29/0852; H01L 29/1045; H01L 29/1095;
(Continued)

(56) References Cited

U.S. PATENT DOCUMENTS 5,932,897 A * 8/1999 Kawaguchi ........... H01L 27/088
257/141
6,307,224 B1 * 10/2001 Shirai ..................... H01L 21/84
257/288

(Continued)

OTHER PUBLICATIONS

R. Roggero, et al., "BCD8sP: An Advanced 0.16 μm Technology Platform with State of the Art Power Devices", Proceedings of the 25th International Symposium on Power Semiconductor Devices & ICs, Kanazawa, (ISPSD2013), 2013, pp. 361-364.

*Primary Examiner* — Cuong B Nguyen
*Assistant Examiner* — Samuel Park
(74) *Attorney, Agent, or Firm* — Sughrue Mion, PLLC

(57) ABSTRACT

To provide a semiconductor device having improved performances. A semiconductor substrate has, in the surface layer portion thereof, an $n^+$ type semiconductor region for source and an $n^+$ type semiconductor region for drain separated from each other. The semiconductor substrate has, on the main surface thereof between the $n^+$ type semiconductor region for source and the $n^+$ type semiconductor region for drain, a gate electrode via an insulating film as a gate insulating film. The semiconductor substrate has, in the main surface thereof between the channel formation region below the gate electrode and the $n^+$ type semiconductor region for drain, a LOCOS oxide film and an STI insulating. Of the LOCOS oxide film and the STI insulating film, the LOCOS oxide film is located on the side of the channel formation region and the STI insulating film is on the side of the $n^+$ type semiconductor region DR for drain.

11 Claims, 25 Drawing Sheets

(51) Int. Cl.
  H01L 29/78 (2006.01)
  H01L 21/761 (2006.01)
  H01L 21/764 (2006.01)
  H01L 21/76 (2006.01)
  H01L 29/423 (2006.01)
  H01L 29/66 (2006.01)
  H01L 29/10 (2006.01)
  H01L 23/31 (2006.01)
  H01L 23/485 (2006.01)
  H01L 23/522 (2006.01)

(52) U.S. Cl.
  CPC .... H01L 29/66659 (2013.01); H01L 29/7835 (2013.01); *H01L 23/3171* (2013.01); *H01L 23/485* (2013.01); *H01L 23/522* (2013.01); *H01L 29/1045* (2013.01); *H01L 29/42368* (2013.01); *H01L 29/665* (2013.01); *H01L 2924/0002* (2013.01)

(58) Field of Classification Search
  CPC .. H01L 29/66613; H01L 29/66674–29/66719; H01L 29/7801–29/7804; H01L 29/7816–29/7824; H01L 29/66106; H01L 29/7808–29/7809
  See application file for complete search history.

(56) References Cited

U.S. PATENT DOCUMENTS

| | | | |
|---|---|---|---|
| 2008/0197410 A1* | 8/2008 | Chiang | H01L 29/0634 257/342 |
| 2009/0001462 A1* | 1/2009 | Huang | H01L 29/063 257/343 |

* cited by examiner

SEMICONDUCTOR DEVICE

CROSS-REFERENCE TO RELATED APPLICATIONS

The disclosure of Japanese Patent Application No. 2014-040989 filed on Mar. 3, 2014 including the specification, drawings, and abstract is incorporated herein by reference in its entirety.

BACKGROUND

The present invention relates to a semiconductor device. It can be suitably used for, for example, semiconductor devices having MISFETs.

MISFETs each have a source region and a drain region formed in a surface layer portion of a semiconductor substrate with a space therebetween and a gate electrode formed, via a gate insulating film, on the semiconductor substrate between the source region and the drain region.

Non-patent Document 1 describes a technology relating to power devices having MOSFETs.

NON-PATENT DOCUMENT

Non-patent Document 1

R. Roggero et al., "BCD8sP: An Advanced 0.16 μm Technology Platform with State of the Art Power Devices", Proceedings of The 25th International Symposium on Power Semiconductor & ICs (ISPSD2013), 2013, p. 361-364

SUMMARY

Even semiconductor devices having MISFETs are desired to have performances as improved as possible; are desired to have a reduced size; or are desired to have both improved performances and a reduced size.

Another problem and novel features will be apparent from the description herein and accompanying drawings.

A semiconductor device according to one embodiment has a LOCOS oxide film and an STI insulating film formed in the main surface of a semiconductor substrate between a channel formation region and a drain semiconductor region and of these LOCOS oxide film and the STI insulating film, the LOCOS oxide film is located on the side of the channel formation region and the STI insulating film is located on the side of the drain semiconductor region.

According to the one embodiment, a semiconductor device having improved performances can be provided.

Or, a semiconductor device having a reduced size can be provided.

Or, a semiconductor device having both improved performances and a reduced size can be provided.

DETAILED DESCRIPTION

Figure 1:
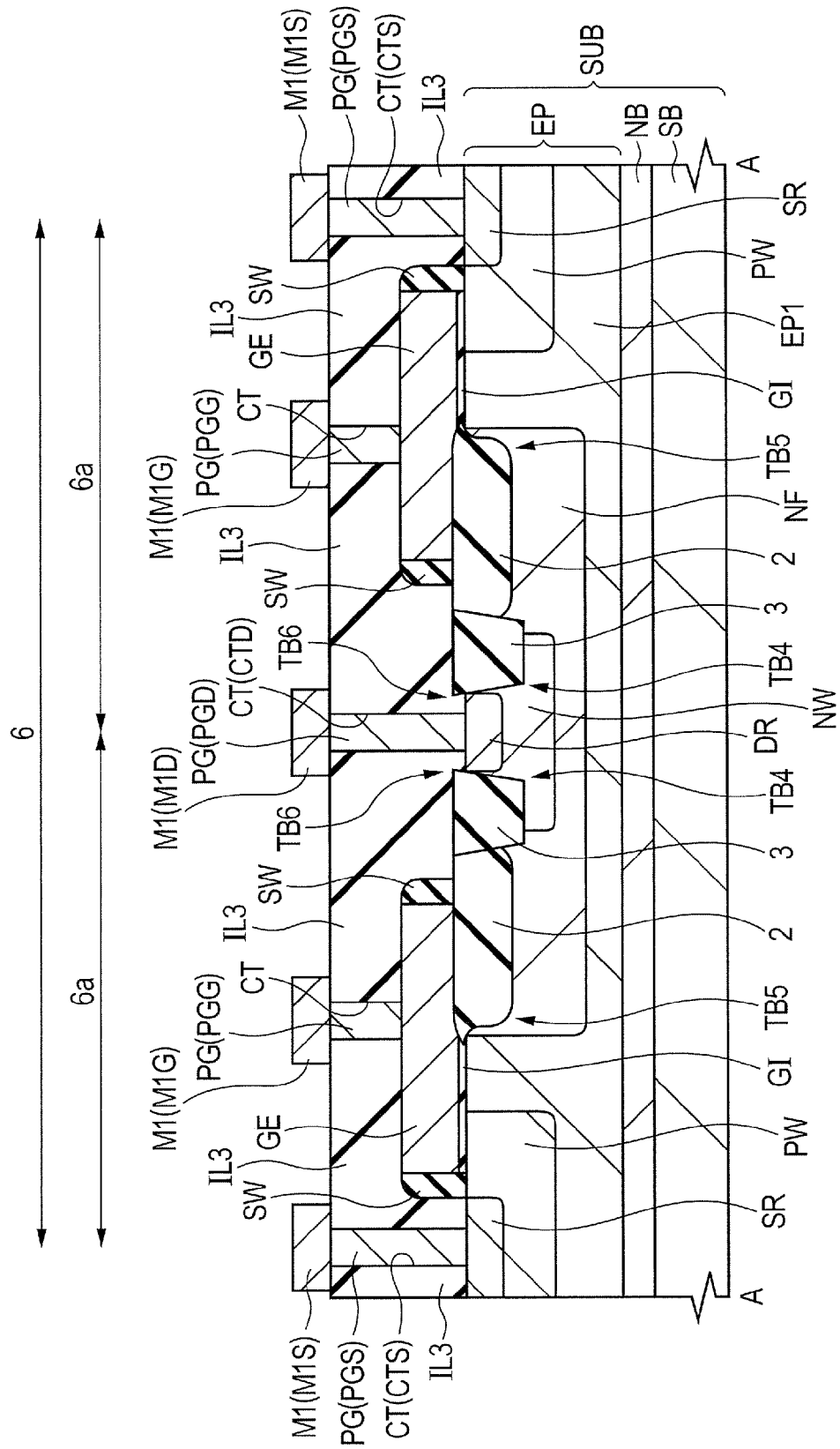
FIG. 1 is a fragmentary cross-sectional view of a semiconductor device according to one embodiment.

In the following embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one. In the following embodiments, when a reference is made to the number of elements (including the number, value, amount, range, or the like), the number is not limited to the specific number but may be more or less than the specific number, unless otherwise particularly specified or principally apparent that the number is limited to the specific number. Further, in the following embodiments, it is needless to say that the constituent component (including component step or the like) is not always essential unless otherwise particularly specified or principally apparent that it is essential. Similarly, in the following embodiments, when a reference is made to the shape, positional relationship, or the like of the constituent component, that substantially approximate or analogous to it in shape or the like is also embraced unless otherwise particularly specified or principally apparent that it is not. This also applies to the above-mentioned number and range.

An embodiment will hereinafter be described in detail based on drawings. In all the drawings for describing the embodiment, members having the same function will be identified by the same reference numerals and overlapping descriptions will be omitted. In the following embodiment, a description on the same or similar portion is not repeated unless otherwise necessary.

In the drawings to be used in the following embodiment, even a cross-sectional view is sometimes not hatched to facilitate understanding of it or even a plan view may be hatched to facilitate understanding of it.

(Embodiment)
<Structure of Semiconductor Device>

Figure 2:
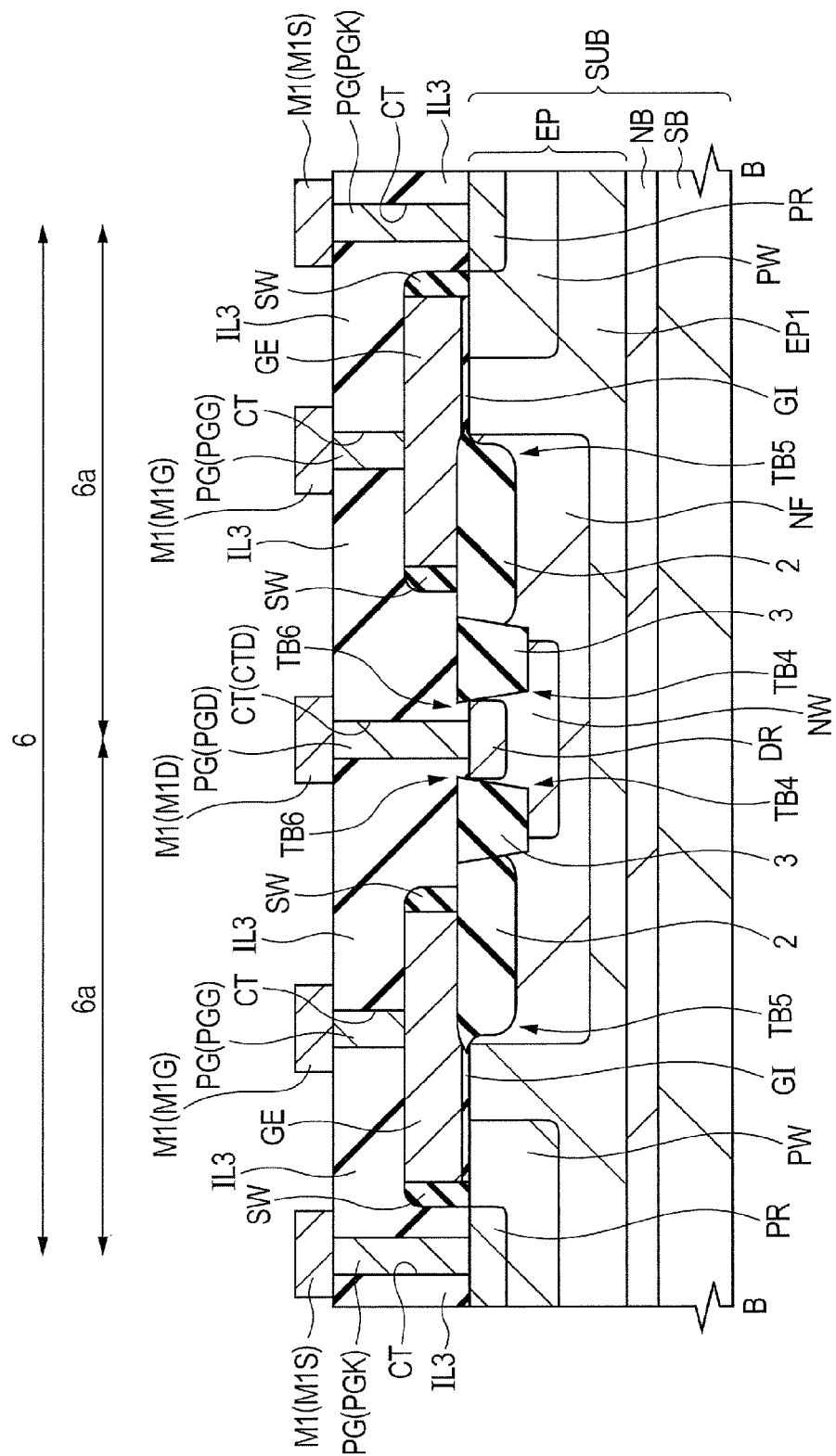
FIG. 2 is a fragmentary cross-sectional view of the semiconductor device according to the one embodiment.
Figure 3:
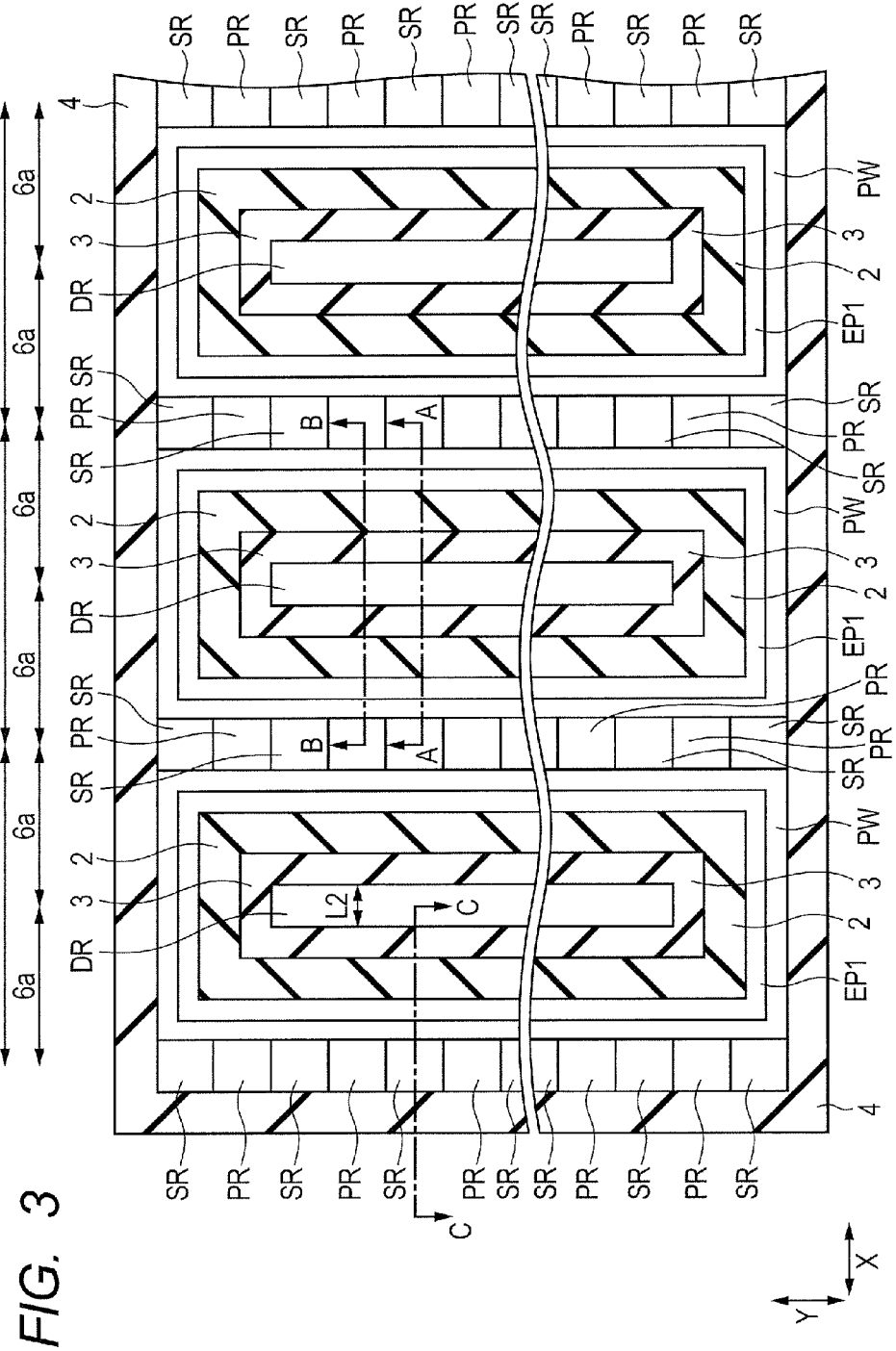
FIG. 3 is a fragmentary plan view of the semiconductor device according to the one embodiment.
Figure 4:
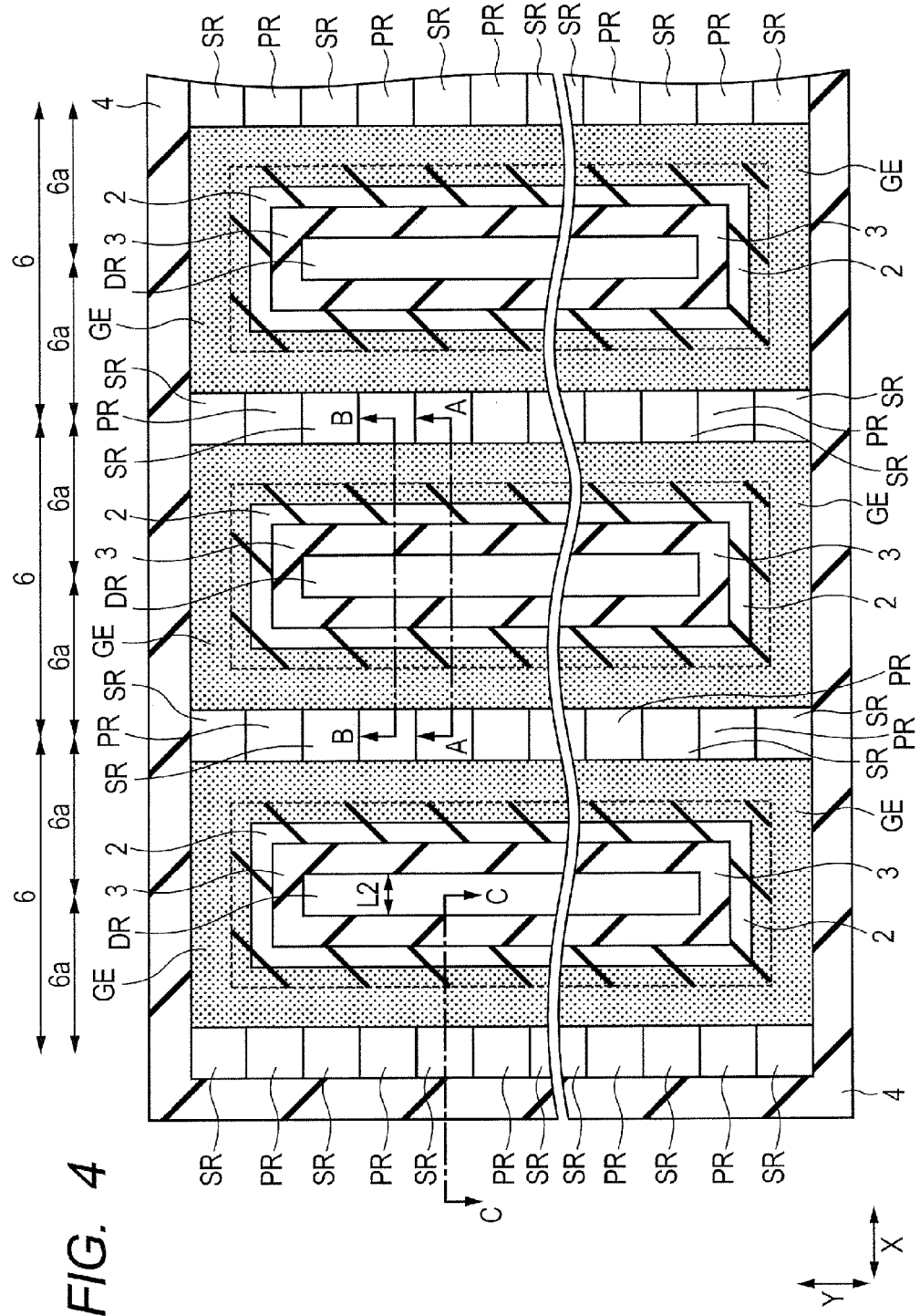
FIG. 4 is a fragmentary plan view of the semiconductor device according to the one embodiment.

The semiconductor device of the present embodiment will hereinafter be described referring to drawings. FIGS. 1 and 2 are fragmentary cross-sectional views of the semiconductor device of the present embodiment; and FIGS. 3 and 4 are fragmentary plan views of the semiconductor device of the present embodiment. The cross-sectional views taken along the line A-A of FIGS. 3 and 4 substantially correspond to FIG. 1 and the cross-sectional views taken along the line B-B of FIGS. 3 and 4 substantially correspond to FIG. 2.

FIGS. 3 and 4 show the same plane region, but FIG. 4 includes, in addition to the members shown in FIG. 3, a gate electrode GE. Although FIGS. 3 and 4 are plan views, a LOCOS oxide film 2, an STI insulating film 3, and an element isolation region 4 are hatched with diagonal lines in FIG. 3, while the LOCOS oxide film 2, the STI insulating film 3, and the element isolation region 4 are hatched with diagonal lines and the gate electrode GE are hatched with dotted lines in FIG. 4.

The semiconductor device of the present embodiment is a semiconductor device having a MISFET (metal insulator semiconductor field effect transistor) and here, it is a semiconductor device having, as the MISFET, a LDMOSFET (laterally diffused metal-oxide-semiconductor field effect transistor).

The term "MOSFET" (metal oxide semiconductor field effect transistor) or "LDMOSFET" as used herein means not only a MISFET using an oxide film (silicon oxide film) as a gate insulating film but also a MISFET using an insulating film other than an oxide film (silicon oxide film) as a gate insulating film. The LDMOSFET is one of MISFET elements.

The structure of the semiconductor device of the present embodiment will hereinafter be described specifically referring to FIGS. 1 to 4.

As shown in FIGS. 1 to 4, a semiconductor substrate SUB has, on the main surface thereof, a LDMOSFET as MISFET. The semiconductor substrate SUB has, for example, a substrate body SB which is a semiconductor substrate made of $p^+$ type single crystal silicon doped with p type impurities such as boron (B) and an epitaxial layer (semiconductor layer, epitaxial semiconductor layer) EP formed on the main surface of the substrate body SB via an n type buried layer (semiconductor layer) NB and made of $p^-$ type single crystal silicon. The semiconductor substrate SUB is therefore a so-called epitaxial wafer. The substrate body SB and the epitaxial layer EP are of the same conductivity type (p type here), but the impurity concentration (p type impurity concentration) of the substrate body SB is higher than the impurity concentration (p type impurity concentration) of the epitaxial layer EP and the resistivity (specific resistance) of the substrate body SB is lower than the resistivity (specific resistance) of the epitaxial layer EP.

A region of the epitaxial layer EP in which a $p^-$ type has been kept will hereinafter be called "$p^-$ type epitaxial layer EP1". The epitaxial layer EP has therein a $p^+$ type well PW, an $n^+$ type semiconductor region SR, a $p^+$ type semiconductor region PR, an $n^-$ type semiconductor region NF, an n type semiconductor region NW, and an $n^+$ type semiconductor region DR and a region other than these regions corresponds to the $p^-$ type epitaxial layer EP1. The $p^-$ type epitaxial layer EP1 therefore has a conductivity type (p type here) same as that of the substrate body SB but the impurity concentration (p type impurity concentration) of the $p^-$ type epitaxial layer EP1 is lower than the impurity concentration (p type impurity concentration) of the substrate SB and the resistivity of the p⁻ type epitaxial layer EP1 is higher than the resistivity of the substrate body SB.

The semiconductor substrate SUB has a LDMOSFET in an active region thereof defined by an element isolation region 4 (in other words, surrounded with the element isolation region 4). As the element isolation region 4, an STI structure or DTI structure (corresponding to a DTI structure 5 which will be described later) can be employed.

More specifically, the epitaxial layer EP of the semiconductor substrate SUB has, therein, the p⁺ type well PW, the n⁺ type semiconductor region SR for source, the p⁺ type semiconductor region PR for supplying power to the p type well PW, the n⁻ type semiconductor region NF for drain, the n type semiconductor region NW, and the n⁺ type semiconductor region DR and the epitaxial layer EP has on the surface thereof a gate electrode GE via an insulating film (gate insulating film) GI as a gate insulating film.

The p type well (p type semiconductor region, p type body layer) PW and the p⁺ type semiconductor region (p type power supply region) PR are each a p type semiconductor region (p type impurity diffusion region) formed in the epitaxial layer EP of the semiconductor substrate SUB. The impurity concentration (p type impurity concentration) of the p⁺ type semiconductor region PR is higher than the impurity concentration (p type impurity concentration) of the p type well PW and the impurity concentration (p type impurity concentration) of the p type well PW is higher than the impurity concentration (p type impurity concentration) of the p⁻ type epitaxial layer EP1.

The n⁺ type semiconductor region (source region) SR, the n⁻ type semiconductor region NF, the n type semiconductor region NW, and the n⁺ type semiconductor region DR are each an n type semiconductor region (n type impurity diffusion region) formed in the epitaxial layer of the semiconductor substrate SUB. The impurity concentration (n type impurity concentration) of the n type semiconductor region (n type drain region, n type drift region) NW is higher than the impurity concentration (n type impurity concentration) of the n⁻ type semiconductor region (lightly-doped drain region, n type offset drain region, an n⁻ type drift region) NF. The impurity concentration (n type impurity concentration) of the n⁺ type semiconductor region (heavily-doped drain region, n⁺ type drain region) DR is higher than the impurity concentration (n type impurity concentration) of the n type semiconductor region NW.

In the epitaxial layer EP of the semiconductor substrate SUB, the p type well PW has therein the n⁺ type semiconductor region SR for source and the p⁺ type semiconductor region PR for supplying power to the p type well PW. In other words, in the epitaxial layer EP of the semiconductor substrate SUB, the p type well PW encloses therein the n⁺ type semiconductor region SR and the p⁺ type semiconductor region PR. The n⁺ type semiconductor region SR and the p⁺ type semiconductor region PR each have a depth shallower than that of the p type well PW. The n⁺ type semiconductor region SR is, at the bottom surface thereof, contiguous to the p type well PW and the p⁺ type semiconductor region PR is, at the bottom surface thereof, contiguous to the p type well PW. In the p type well PW, the n⁺ type semiconductor region SR and the p⁺ type semiconductor region PR may be sometimes adjacent (contiguous) to each other and the n⁺ type semiconductor region SR and the p⁺ type semiconductor region PR may be sometimes separated from each other via a portion of the p type well PW. The n⁺ type semiconductor region SR and the p⁺ type semiconductor region PR are, at the side surfaces thereof, contiguous to the p type well PW, respectively, but when the n⁺ type semiconductor region SR and the p⁺ type semiconductor region PR are adjacent (contiguous) to each other, the n⁺ type semiconductor region SR and the p⁺ type semiconductor region PR are, at the side surfaces thereof opposite to each other, adjacent (contiguous) to each other.

The n⁺ type semiconductor region SR is an n type semiconductor region functioning as a source region of the LDMOSFET. The p⁺ type semiconductor region PR is provided so as to supply a desired potential from a plug PG (that is, a power supply plug PGK) formed on the p⁺ type semiconductor region PR to the p type well PW via the p⁺ type semiconductor region PR.

The n⁺ type semiconductor region SR and the p⁺ type semiconductor region PR are supplied with the same potential (voltage). A plug PG (that is, a plug PGS for source) placed on the n⁺ type semiconductor region SR and electrically coupled to the n⁺ type semiconductor region SR and a plug PG (that is, a power supply plug PGK) placed on the p⁺ type semiconductor region PR and electrically coupled to the p⁺ type semiconductor region PR are therefore electrically coupled to a common source wiring M1S. Accordingly, a predetermined source voltage is supplied from the wiring M1S for source to the n⁺ type semiconductor region SR via the plug PG (plug PGS for source) and at the same time, a voltage equal to the source voltage can be supplied from the wiring M1S for source to the p⁺ type semiconductor region PR via the plug PG (power supply plug PGK).

The p type well PW is, at the bottom surface and side surface thereof, contiguous to a p⁻ type portion of the epitaxial layer EP (that is, the p⁻ type epitaxial layer EP1). The n⁻ type semiconductor region NF is, at the bottom surface and the side surface thereof, contiguous to the p⁻ type portion of the epitaxial layer EP (that is, the p⁻ type epitaxial layer EP1).

Both the p type well PW and the n⁻ type semiconductor region NF are in the epitaxial layer EP but they are separated from each other via the p⁻ type portion of the epitaxial layer EP (that is, the p⁻ type epitaxial layer EP1). In other words, the p type well PW and the n⁻ type semiconductor region NF are separated from each other in a gate length direction of the gate electrode GE and when viewed in the gate length direction, the p type well PW and the n⁻ type semiconductor region NF have therebetween the p⁻ type portion of the epitaxial layer EP (that is, the p⁻ type epitaxial layer EP1). The n⁺ type semiconductor region SR for source and the n⁻ type semiconductor region NF for drain have therebetween a portion of the p type well PW and the p⁻ type portion of the epitaxial layer EP (that is, the p⁻ type epitaxial layer EP1).

The term "gate length direction" means a gate length direction of the gate electrode GE. The term "gate width direction" means a gate width direction of the gate electrode GE. The term "channel length direction" has the same meaning as the term "gate length direction, while the term "channel width direction" has the same meaning as the term "gate width direction".

In the epitaxial layer EP of the semiconductor substrate SUB, the n type semiconductor region NW lies in the n⁻ type semiconductor region NF. In other words, in the epitaxial layer EP of the semiconductor substrate SUB, the n⁻ type semiconductor region NF encloses therein the n type semiconductor region NW. Therefore, the n type semiconductor region NW has a depth shallower than that of the n⁻ type semiconductor region NF and the n type semiconductor region NW is, at the bottom and side surfaces thereof, contiguous to the n⁻ type semiconductor region NF.

In the epitaxial layer EP of the semiconductor substrate SUB, the $n^+$ type semiconductor region DR lies in the n type semiconductor region NW. In other words, in the epitaxial layer EP of the semiconductor substrate SUB, the n type semiconductor region NW encloses therein the $n^+$ type semiconductor region DR. Therefore, the $n^+$ type semiconductor region DR has a depth shallower than that of the n type semiconductor region NW. The $n^+$ type semiconductor region DR is, at the bottom surface thereof, contiguous to the n type semiconductor region NW and the $n^+$ type semiconductor region DR is, at the side surface thereof, contiguous to the n type semiconductor region NW or an STI insulating film 3.

The $n^-$ type semiconductor region NF, the n type semiconductor region NW, and the $n^+$ type semiconductor region DR are each an n type semiconductor region for drain. Each of the n type semiconductor region NW and the $n^+$ type semiconductor region DR is not contiguous to a channel formation region, and of the $n^-$ type semiconductor region NF, the n type semiconductor region NW, and the $n^+$ type semiconductor region DR, the $n^-$ type semiconductor region NF having the lowest impurity concentration is contiguous to the channel formation region. In the epitaxial layer EP of the semiconductor substrate SUB, the $n^+$ type semiconductor region DR and the channel formation region have therebetween the n type semiconductor region NW and the $n^-$ type semiconductor region NF having an impurity concentration lower than that of the $n^+$ type semiconductor region DR. The $n^+$ type semiconductor region DR is contiguous to the n type semiconductor region NW but not contiguous to the $n^-$ type semiconductor region NF and the $n^+$ type semiconductor region DR and the $n^-$ type semiconductor region NF have therebetween the n type semiconductor region NW. The n type semiconductor region NW and the channel region have therebetween the $n^-$ type semiconductor region NF having an impurity concentration lower than that of the n type semiconductor region NW. A space (distance) between the channel formation region and the $n^+$ type semiconductor region DR for drain is greater than the space (distance) between the channel formation region and the $n^+$ type semiconductor region SR for source.

The semiconductor substrate SUB has, on the main surface thereof (that is, on the surface of the epitaxial layer EP), a gate electrode GE of the LDMOSFET via an insulating film GI as a gate insulating film. In other words, the semiconductor substrate SUB has, on the main surface thereof (that is, on the surface of the epitaxial layer EP) between the $n^+$ type semiconductor region SR for source and the $n^+$ type semiconductor region DR for drain, a gate electrode GE via an insulating film GI as a gate insulating film.

The insulating film GI is made of, for example, a silicon oxide film. The gate electrode GE is made of, for example, a polycrystalline silicon film doped with impurities (for example, n type impurities) (a doped polysilicon film). The gate electrode GE is comprised of a single-layer film or a stacked film and when the gate electrode GE is made of a silicon film, the gate electrode GE may have thereon a metal silicide layer (corresponding to a metal silicide layer described later).

The gate electrode GE lies on the $p^-$ type epitaxial layer EP1 and the p type well PW via the insulating film GI. This means that the gate electrode GE lies on a portion of the $p^-$ type epitaxial layer EP1 located between the p type well PW and the $n^-$ type semiconductor region NF and on the p type well PW via the insulating film GI as a gate insulating film. A portion of the gate electrode GE therefore extends on the p type well PW via the insulating film GI. A surface layer portion of the p type well PW and the $p^-$ type epitaxial layer EP1 located immediately below the gate electrode GE becomes a channel formation region. The gate electrode GE and the epitaxial layer EP have therebetween the insulating film GI and the insulating film GI between the gate electrode GE and the epitaxial layer EP functions as a gate insulating film.

The semiconductor substrate SUB has, in the main surface thereof between the channel formation region below the gate electrode GE and the $n^+$ type semiconductor region DR for drain, a LOCOS oxide film 2 and an STI insulating film 3. Of the LOCOS oxide film 2 and the STI insulating film 3, the LOCOS oxide film 2 is on the side of the channel formation region and the STI insulating film 3 is on the side of the $n^+$ type semiconductor region DR. A portion of the gate electrode GE lies on the LOCOS oxide film 2, meaning that a portion of the gate electrode GE is located on the LOCOS oxide film 2.

More specifically, in plan view, the LOCOS oxide film 2 and the STI insulating film 3 surround the $n^+$ type semiconductor region DR for drain. In plan view, the channel formation region and the $n^+$ type semiconductor region DR for drain have therebetween the LOCOS oxide film 2 and the STI insulating film 3. The LOCOS oxide film 2 is on the side of the channel formation region and the STI insulating film 3 is on the side of the $n^+$ type semiconductor region DR. In plan view, the LOCOS oxide film 2 and the STI insulating film 3 are adjacent to each other. The STI insulating film 3 is placed on the side near the $n^+$ type semiconductor region DR for drain and the LOCOS oxide film 2 is placed on the side near the channel formation region (on the side near the source region). In plan view, the STI insulating film 3 surrounds the $n^+$ type semiconductor region DR for drain and the LOCOS oxide film 2 surrounds the STI insulating film 3 adjacently to the STI insulating film 3. In plan view, therefore, the STI insulating film 3 and the LOCOS oxide film 2, side by side, go around the $n^+$ type semiconductor region DR for drain and, the STI insulating film 3 is placed on the inner side (that is, on the side near the $n^+$ type semiconductor region DR) and the LOCOS oxide film 2 is placed on the outer side (that is, on the side near the channel formation region, in other words, on the side near the source region).

The LOCOS oxide film (LOCOS isolation film) 2 described herein is an oxide film (silicon oxide film) formed by LOCOS (local oxidation of silicon) method. LOCOS method is a method of forming an oxidation-resistant film (for example, silicon nitride film) on the main surface of a semiconductor substrate and thermally oxidizing the semiconductor substrate to selectively (locally) form a thermal oxide film (LOCOS oxide film) on the main surface of the semiconductor substrate in a region not covered with the oxidation-resistant film. The thermal oxide film thus formed is a LOCOS oxide film (LOCOS isolation film).

The STI insulating film (STI isolation film) 3 is an insulating film formed by STI (shallow trench isolation) method. The STI method is a method of forming a trench in the main surface of a semiconductor substrate and then filling the trench with an insulating film. The insulating film with which the trench is filled is an STI insulating film (STI isolation film).

Thus, in plan view, the channel formation region and the $n^+$ type semiconductor region DR for drain have therebetween the LOCOS oxide film 2 and the STI insulating film 3. The LOCOS oxide film 2 and the STI insulating film 3 have therebelow the $n^-$ type semiconductor region NF and the n type semiconductor region NW having an impurity concentration lower than that of the n+ type semiconductor region DR. Therefore, the channel formation region and the n+ type semiconductor region DR for drain have therebetween the n− type semiconductor region NF and the n type semiconductor region NW having an impurity concentration lower than that of the n+ type semiconductor region DR. The channel formation region and the n+ type semiconductor region DR for drain have therebetween the n− type semiconductor region NF and the n type semiconductor region NW and the n type semiconductor region NW is on the side near the n+ type semiconductor region DR, while the n− type semiconductor region NF is on the side near the channel formation region. The n− type semiconductor region NF and the n type semiconductor region NW extending below the LOCOS oxide film 2 and the STI insulating film 3 therefore function as a conduction path between the channel formation region and the n+ type semiconductor region DR for drain. The n+ type semiconductor region DR for drain is therefore coupled to the channel formation region via the n type semiconductor region NW and the n− type semiconductor region NF extending below the LOCOS oxide film 2 and the STI insulating film 3.

According to the drawings and description in the present embodiment, the LOCOS oxide film 2 and the STI insulating film 3 are contiguous to each other. In another embodiment, the LOCOS oxide film 2 and the STI insulating film 3 may be separated from each other.

As described above, the gate electrode GE lies on the epitaxial layer EP of the semiconductor substrate SUB via the insulating film GI, but a portion of the gate electrode GE lies on the LOCOS oxide film 2. This means that the gate electrode GE has, as one body, a portion formed on the epitaxial layer EP via the insulating film GI and a portion located on the LOCOS oxide film 2. The LOCOS oxide film 2 is not required to have thereon the insulating film GI so that a portion of the gate electrode GE located on the LOCOS oxide film 2 may be contiguous to the LOCOS oxide film 2.

The semiconductor substrate SUB has, on the main surface thereof, an insulating film (interlayer insulating film) IL3 as an interlayer insulating film so as to cover the gate electrode GE therewith. The insulating film IL3 is made of, for example, a silicon oxide film. The insulating film IL3 has a planarized upper surface. A stacked insulating film may be used as the insulating film IL3. For example, a film obtained by stacking a silicon oxide film over a silicon nitride film may be used as the insulating film IL3 and in this case, the silicon oxide film is preferably made thicker than the silicon nitride film. The term "stacked insulating film" means a stacked film composed of a plurality of insulating films.

The insulating film IL3 has therein contact holes (opening portions, through-holes, via-holes) CT and the contact holes CT have therein, for example, a conductive plug (buried conductor for coupling, contact plug) PG composed mainly of, for example, a tungsten (W) film. This means that the contact holes CT formed in the insulating film IL3 have therein the conductive plug PG. The plugs PG are each a coupling plug, in other words, a contact plug. The plugs PG filling therewith the contact holes CT formed in the insulating film IL3 are on the gate electrode GE, on the n+ type semiconductor region DR for drain, on the n+ type semiconductor region SR for source, and on the power supplying p+ type semiconductor region PR, respectively. The plugs PG are provided for electrically coupling between the wiring M1 and various semiconductor regions (such as n+ type semiconductor region DR, n+ type semiconductor region SR, and p+ type semiconductor region PR) provided in the semiconductor substrate SUB or various conductive members (such as gate electrode) provided on the semiconductor substrate SUB.

Among the plugs PG, the plug PG placed on the gate electrode GE and electrically coupled to this gate electrode GE will hereinafter be called a "gate plug PGG". Among the plugs PG, the plug PG placed on the n+ type semiconductor region DR for drain and electrically coupled to this n+ type semiconductor region DR for drain will hereinafter be called "drain plug PGD". Among the plugs, the plug PG placed on the n+ type semiconductor region SR for source and electrically coupled to this n+ type semiconductor region SR will hereinafter be called "source plug PGS". Among the plugs PG, the plug placed on the power supplying p+ type semiconductor region PR and electrically coupled to this p+ type semiconductor region PR will hereinafter be called "power supply plug PGK". Among the contact holes CT, the contact hole CT to be filled with the drain plug PGD will hereinafter be called "drain contact hole CTD". The drain contact hole CTD is in the insulating film IL3 (interlayer insulating film) on the n+ type semiconductor region for drain and the drain contact hole CTD has therein the drain plug PGD. The drain plug PGD with which the drain contact hole CTD is filled is electrically coupled to the n+ type semiconductor region DR for drain. Among the contact holes CT, the contact hole CT to be filled with the source plug PGS will hereinafter be called "source contact hole CTS". The source contact hole CTS is in the insulating film IL3 (interlayer insulating film) on the n+ type semiconductor region SR for source and the source contact hole CTS has therein the source plug PGS. The source plug PGS with which the source contact hole CTS is filled is electrically coupled to the n+ type semiconductor region SR for source.

In the semiconductor device shown in FIGS. 1 and 2, the n+ type semiconductor region DR, the n+ type semiconductor region SR, the p+ type semiconductor region PR, and the gate electrode GE have thereon no metal silicide layer, but even in the semiconductor device shown in FIGS. 1 and 2, the n+ type semiconductor region DR, the n+ type semiconductor region SR, the p+ type semiconductor region PR, and the gate electrode GE may have thereon a metal silicide layer as shown later in FIG. 20.

The drain plug PGD formed on the n+ type semiconductor region DR for drain is contiguous to the n+ type semiconductor region DR and is thereby electrically coupled to this n+ type semiconductor region DR. When a metal silicide layer (corresponding to a metal silicide layer SL which will be described later) is formed on the n+ type semiconductor region DR for drain, the drain plug PGD is contiguous to the metal silicide layer (corresponding to the metal silicide layer SL which will be described later) on the n+ type semiconductor region DR and is thereby electrically coupled to this n+ type semiconductor region DR for drain via the metal silicide layer.

The source plug PGS formed on the n+ type semiconductor region SR for source is contiguous to the n+ type semiconductor region SR and is thereby electrically coupled to this n+ type semiconductor region SR. When a metal silicide layer (corresponding to the metal silicide layer SL which will be described later) is formed on the n+ type semiconductor region SR for source, the source plug PGS is contiguous to the metal silicide layer (corresponding to the metal silicide layer SL which will be described later) on the n+ type semiconductor region SR and is thereby electrically coupled to this n+ type semiconductor region SR for source via the metal silicide layer.

The power supply plug PGK formed on the power supplying p⁺ type semiconductor region PR is contiguous to the p⁺ type semiconductor region PR and is thereby electrically coupled to this p⁺ type semiconductor region PR. When a metal silicide layer (corresponding to the metal silicide layer SL which will be described later) is formed on the power supplying p⁺ type semiconductor region PR, the power supply plug PGK is contiguous to the metal silicide layer (corresponding to the metal silicide layer SL which will be described later) on the p⁺ type semiconductor region PR and is thereby electrically coupled to this power supplying p⁺ type semiconductor region PR via the metal silicide layer.

The gate plug PGG formed on the gate electrode GE is contiguous to gate electrode GE and is thereby electrically coupled to this gate electrode GE. When a metal silicide layer (corresponding to the metal silicide layer SL which will be described later) is formed on the gate electrode GE, the gate plug PGG is contiguous to the metal silicide layer (corresponding to the metal silicide layer SL which will be described later) on the gate electrode GE and is thereby electrically coupled to this gate electrode GE via the metal silicide layer.

The insulating film IL3 filled with the plug PG has, on this insulating film, wirings (first-layer wirings) M1. The wirings M1 are each formed by forming a conductive film on the insulating film IL3 filled with the plug PG and then patterning the conductive film. In this case, the wirings M1 are each made of a patterned conductive film. As the wirings M1, for example, an aluminum wiring can be suitably used. In another embodiment, damascene wirings (buried wirings) formed by damascene method may be used as the wirings M1. The insulating film IL3 and the wirings M1 have thereover another interlayer insulating film and wirings, but they are neither illustrated nor described here.

Among the wirings M1, the wiring M1 electrically coupled to the gate electrode GE via the plug PG (more specifically, the gate plug PGG) will hereinafter be called "gate wiring M1G". Among the wirings M1, the wiring M1 electrically coupled the n⁺ type semiconductor region DR for drain via the plug PG (more specifically, the drain plug PGD) will hereinafter be called "drain wiring M1D". Among the wirings M1, the wiring M1 electrically coupled to the n⁺ type semiconductor region SR for source via the plug PG (more specifically, the source plug PGS) will hereinafter be called "source wiring M1S". The gate wiring M1G, the drain wiring M1D, and the source wiring M1S are separated from one another. This means that the gate wiring M1G and the drain wiring M1D are not coupled to each other via a conductor; and the gate wiring M1G and the source wiring M1S are not coupled to each other via a conductor; and the source wiring M1S and the drain wiring M1D are not coupled to each other via a conductor.

A desired drain voltage (drain potential) can be supplied from the drain wiring M1D to the n⁺ type semiconductor region DR for drain via the drain plug PGD. A desired gate voltage (gate potential) can be supplied from the gate wiring M1G to the gate electrode GE via the gate plug PG. A desired source voltage (source potential) can be supplied from the source wiring M1S to the n⁺ type semiconductor region SR for source via the source plug PGS.

The source plug PGS is coupled to the source wiring M1S and the power supply plug PGK is also coupled to the source wiring M1S. This means that the n⁺ type semiconductor region SR for source and the power supplying p⁺ type semiconductor region PR are electrically coupled to the common source wiring M1S via the plug PG. In other words, the n⁺ type semiconductor region SR for source and the power supplying p⁺ type semiconductor region PR are electrically coupled to each other via the source plug PGS, the source wiring M1S, and the power supply plug PGK. Therefore, a desired source voltage is supplied from the source wiring M1S to the n⁺ type semiconductor region SR via the source plug PGS and at the same time, from this source wiring M1S, a voltage equal to the source voltage is supplied to the p⁺ type semiconductor region PR (and also the p type well PW) via the power supply plug PGK.

Next, operation when an electric current is applied to the LDMOSFET will be described. A drain voltage to be supplied from the drain wiring M1D to the n⁺ type semiconductor region DR for drain via the drain plug PGD is made higher than a source voltage to be supplied from the source wiring M1S to the n⁺ type semiconductor region SR for source via the source plug PGS. A predetermined gate voltage (a voltage higher than the threshold voltage) is supplied from the gate wiring M1G to the gate electrode GE via the gate plug PGG to set the LDMOSFET to ON state. The channel formation region of the LDMOSFET therefore is set to ON state (conduction state), making it possible to apply a current between the n⁺ type semiconductor region SR for source and the n⁺ type semiconductor region DR for drain via the channel formation region immediately below the gate electrode GE, the n⁻ type semiconductor region NF, and the n type semiconductor region NW. In other words, a current (source/drain current) can be applied between the source wiring M1S and the drain wiring M1D via the source plug PGS, the n⁺ type semiconductor region SR, the channel formation region, the n⁻ type semiconductor region NF, the n type semiconductor region NW, the n⁺ type semiconductor region DR, and the drain plug PGD.

Alternatively, a power MISFET can be formed by forming a plurality of LDMOSFET cells, that is, unit LDMOSFET elements on the main surface of the semiconductor substrate SUB and then coupling these unit LDMOSFET elements to each other in parallel.

Described specifically, a power MISFET can be formed by forming a plurality of unit LDMOSFETs 6a in the LDMOSFET formation region of the main surface of the semiconductor substrate SUB and then coupling these unit LDMOSFETs 6a formed in the LDMOSFET formation region to each other in parallel via a wiring (any of wirings M1 to M4) as shown in FIGS. 3 and 4. The term "LDMOSFET formation region" as used herein means a plane region having therein a plurality of unit LDMOSFETs 6a configuring a power MISFET in the main surface of the semiconductor substrate SUB and the LDMOSFET formation region is, in plan view, surrounded with an element isolation region 4.

In the LDMOSFET formation region, the structure of the unit cells (repeating units, unit regions) 6 as shown in FIGS. 1 to 4 is repeated in the direction X. The unit cells 6 each have two unit cells LDMOSFETs (LDMOSFET cells) 6a. In other words, the unit cell 6 is a unit to be repeated, but each unit cell 6 is comprised of two unit LDMOSFETs 6a having a structure symmetrical with respect to the direction X, with the n⁺ type semiconductor region DR which is a heavily doped drain region in common. The LDMOSFET is a MISFET element so that the unit LDMOSFET 6a can be regarded as a unit MISFET element.

In the LDMOSFET formation region, the structure (layout) of the unit cell 6 is repeated in the direction X, by which many (plural) unit LDMOSFETs 6a are formed (placed) and these many (plural) unit LDMOSFETs 6a are coupled to each other in parallel via the wirings (M1 to M4) or the plugs (PG to PG4). This means that in the LDMOSFET formation region, the unit LDMOSFETs 6a are arranged in repetition in the direction X and these plural unit LDMOSFETs 6a arranged in the LDMOSFET formation region are coupled to each other in parallel via the wirings (M1 to M4) or the plugs (PG to PG4).

In order to couple the unit LDMOSFETs 6a formed in the LDMOSFET formation region to each other in parallel, the gate electrodes GE of the unit LDMOSFETs 6a in the LDMOSFET formation region are electrically coupled to each other via the gate plug PGG and the gate wiring M1G or, if necessary, another wiring (M2 to M4). The sources ($n^+$ type semiconductor regions SR) of the unit LDMOSFETs 6a formed in the LDMOSFET formation region are electrically coupled to each other via the source plug PGS and the source wiring M1S or if necessary, another wiring (M2 to M4). The drains ($n^+$ type semiconductor regions DR) of the unit LDMOSFETs 6a formed in the LDMOSFET formation region are electrically coupled to each other via the drain plug PGD and the drain wiring M1D or if necessary, another wiring (M2 to M4).

In FIGS. 3 and 4, the direction X is a direction along the gate length direction of the gate electrode GE and is therefore a direction along the channel length direction. On the other hand, a direction Y is a direction crossing the direction X, more specifically, a direction orthogonal to the direction X.

In each of the unit LDMOSFETs 6a, the gate electrode GE extends in the direction Y. In FIG. 4, in a pair of the unit LDMOSFETs 6a adjacent to each other in the direction X with the $n^+$ type semiconductor region DR which is a heavily doped drain region in common, end portions (end portions in the direction Y) of two gate electrodes GE extending in the direction Y and opposite to each other in the direction X are linked by a link portion (this link portion is formed integrally with the gate electrode GE) extending in the direction X, but they are not necessarily linked to each other thereby.

On the side of the drain of each of the unit LDMOSFETs 6a, the $n^+$ type semiconductor region DR (heavily-doped drain region) extends in the direction Y.

FIGS. 3 and 4 show that on the side of the source of each of the unit LDMOSFETs 6a, the $n^+$ type semiconductor region SR (source region) and the $p^+$ type semiconductor region PR (power supply region) are arranged alternately in the direction Y. In another embodiment, on the side of the source of each of the unit LDMOSFETs 6a, the $n^+$ type semiconductor region SR (source region) and the $p^+$ type semiconductor region PR (power supply region) may each extend in the direction Y. In this case, the $n^+$ type semiconductor region SR (source region) extending in the direction Y is placed on the side near the channel formation region (that is, on the side near the gate electrode GE).

<Manufacturing Steps of the Semiconductor Device>

Figure 27:
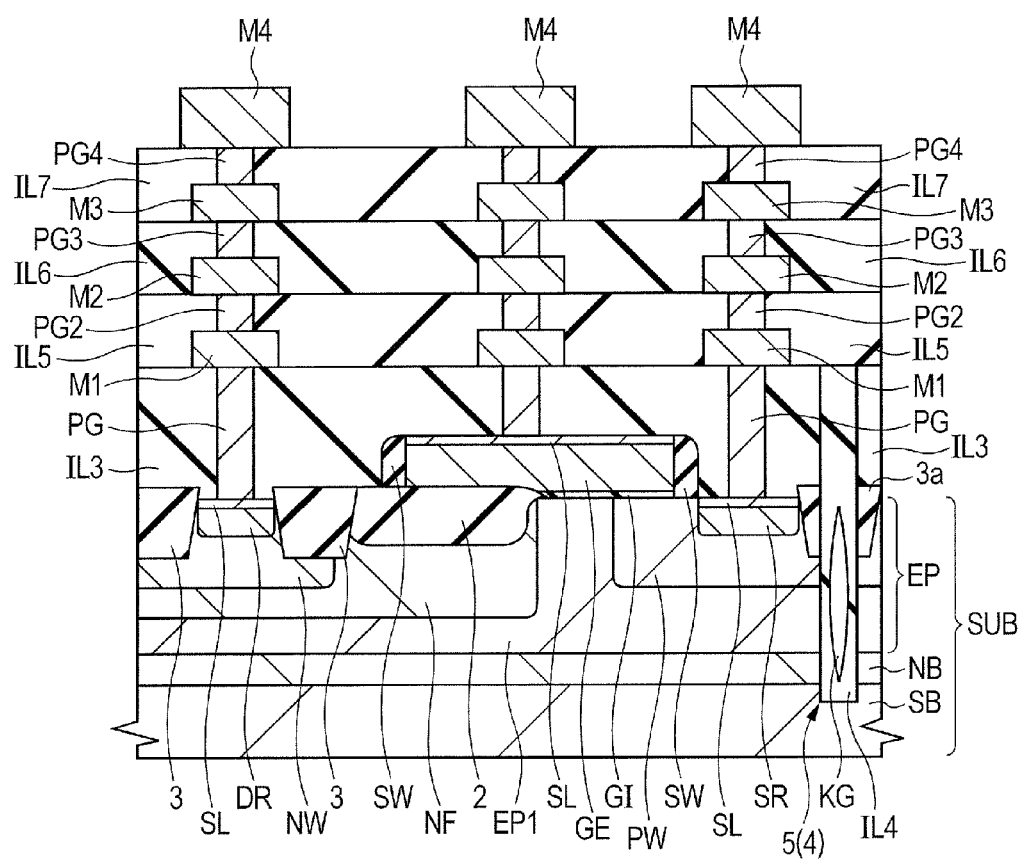
FIG. 27 is a fragmentary cross-sectional view of the semiconductor device during a manufacturing step following that of FIG. 26.
Figure 28:
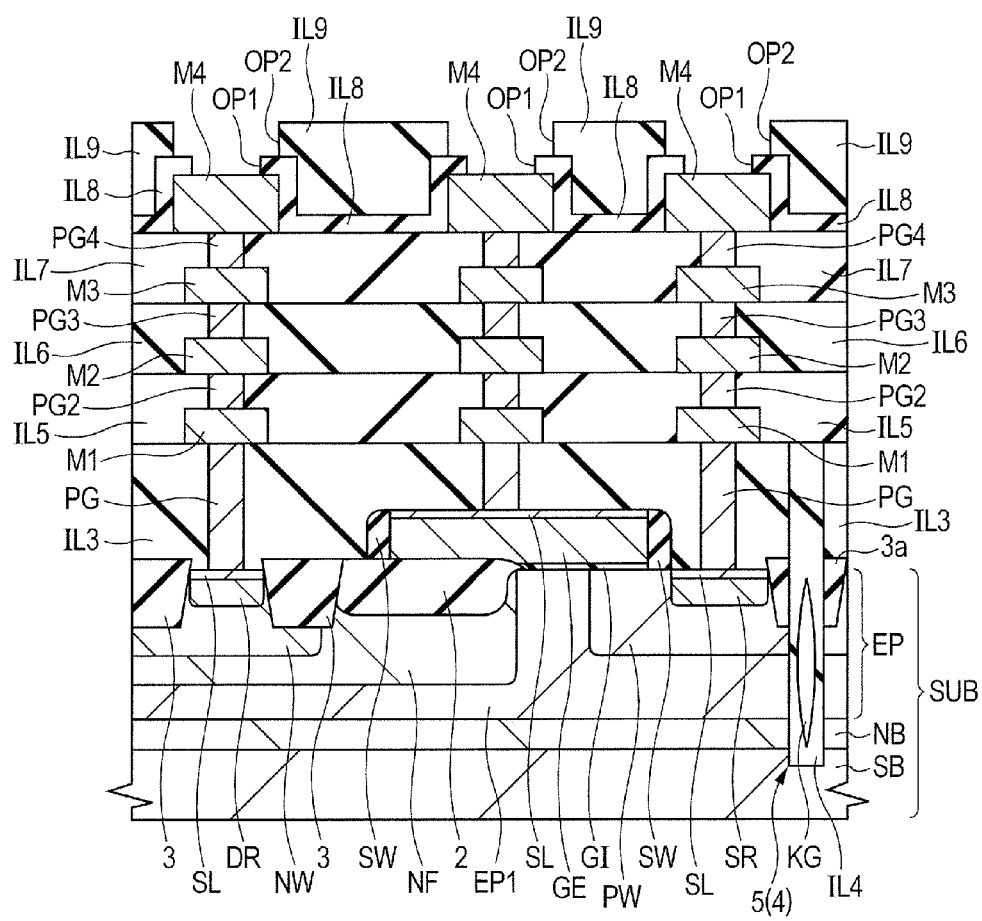
FIG. 28 is a fragmentary cross-sectional view of the semiconductor device during a manufacturing step following that of FIG. 27.

Manufacturing steps of the semiconductor device of the present embodiment will hereinafter be described referring to drawings. FIGS. 5 to 28 are fragmentary cross-sectional views of the semiconductor device of the present embodiment during manufacturing steps thereof. FIGS. 5 to 28 substantially correspond to the cross-sectional views of FIGS. 3 and 4 taken along the line C-C. FIGS. 27 and 28 however schematically show the wirings M2 to M4 and the opening portions OP1 and OP2 and the actual layout (plane position and plane shape) of the wirings M2 to M4 and the opening portions OP1 and OP2 may be different from the layout of FIGS. 27 and 28.

Figure 5:
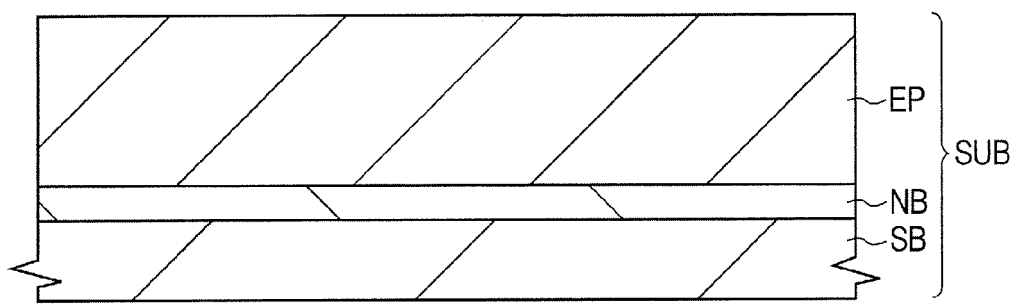
FIG. 5 is a fragmentary cross-sectional view of the semiconductor device according to the one embodiment during a manufacturing step thereof.

First, as shown in FIG. 5, a semiconductor substrate SUB is provided (prepared).

The semiconductor substrate SUB has a substrate body SB which is a semiconductor substrate (semiconductor wafer) made of, for example, $p^+$ type single crystal silicon doped with p type impurities such as boron (B) and a $p^-$ type epitaxial layer EP formed on the main surface of the substrate body SB via an n type buried layer NB and it is a so-called epitaxial wafer. In the semiconductor substrate SUB, the buried layer NB is present between the substrate body SB and the epitaxial layer EP. The epitaxial layer EP is a semiconductor layer formed by epitaxial growth. The impurity concentration of the epitaxial layer EP is lower than that of the substrate body SB and the resistivity of the epitaxial layer EP is higher than that of the substrate body SB. The epitaxial layer EP and the buried layer NB can be regarded as a portion of the semiconductor substrate SUB.

The semiconductor substrate SUB can be provided, for example, as follows. Described specifically, first, a substrate body SB which is a semiconductor substrate (semiconductor wafer) made of $p^+$ type single crystal silicon or the like is provided. Then, an n type semiconductor layer (semiconductor layer to be a buried layer NB) is formed in the surface layer portion of the substrate body SB by introducing n type impurities such as antimony (Sb) into the surface layer portion of the substrate body SB by ion implantation and then diffusing (thermally diffusing) the resulting impurities by thermal treatment. Then, an epitaxial layer EP made of $p^-$ type single crystal silicon is formed on the main surface of the substrate body SB, that is, on the n type semiconductor layer by epitaxial growth. As a result, the semiconductor substrate SUB can be obtained which has the $p^-$ type epitaxial layer EP on the $p^+$ type substrate body SB via the n type buried layer NB made of the n type semiconductor layer.

Next, a LOCOS oxide film (LOCOS isolation film) 2 is formed in the main surface of the semiconductor substrate SUB, that is, in the main surface of the epitaxial layer EP by LOCOS method.

Figure 6:
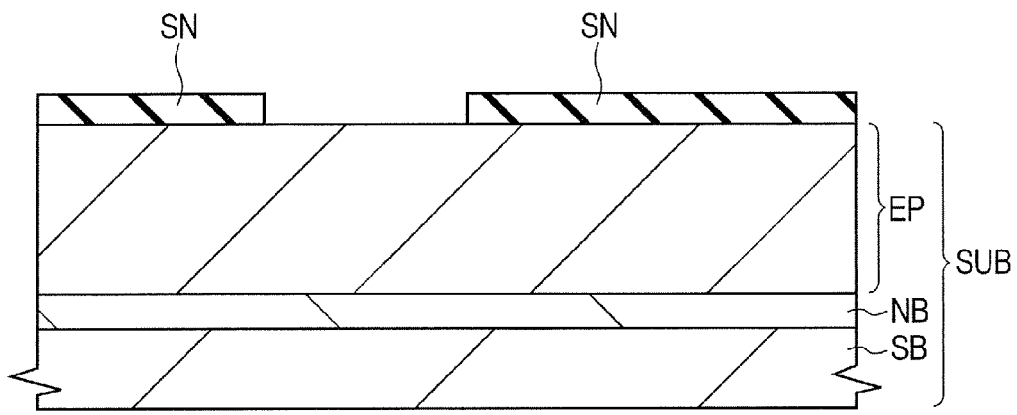
FIG. 6 is a fragmentary cross-sectional view of the semiconductor device during a manufacturing step following that of FIG. 5.
Figure 7:
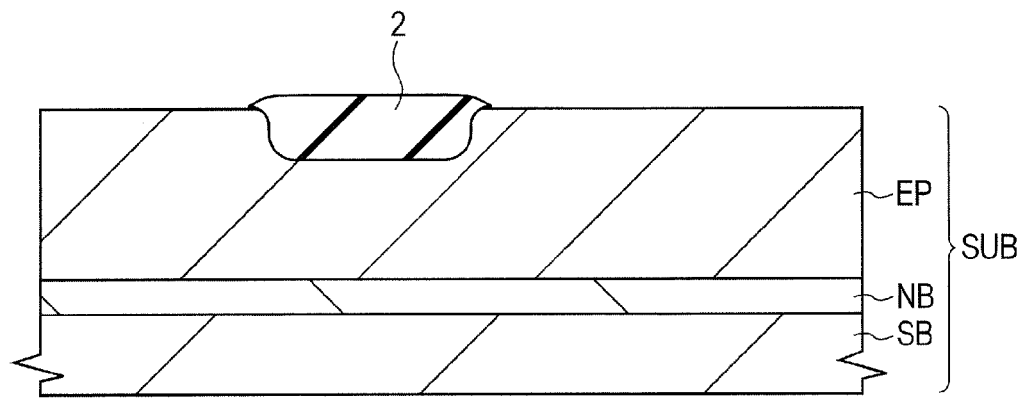
FIG. 7 is a fragmentary cross-sectional view of the semiconductor device during a manufacturing step following that of FIG. 6.

More specifically, the LOCOS oxide film 2 can be formed, for example, as follows (FIGS. 6 and 7).

Described specifically, as shown in FIG. 6, after formation of a silicon nitride film SN to be used as a thermal oxidation-resistant film on the main surface of the semiconductor substrate SUB (that is, on the main surface of the epitaxial layer EP), the silicon nitride film SN is removed by photolithography and etching from a region in which a LOCOS oxide film is to be formed. As a result, as shown in FIG. 6, the region in which a LOCOS oxide film is to be formed does not have therein the silicon nitride film SN and a region in which a LOCOS oxide film is not to be formed has therein the silicon nitride film SN. Then, thermal oxidation is performed to oxidize the surface of the semiconductor substrate SUB (that is, the surface of the epitaxial layer EP) in the region not covered with the silicon nitride film (that is, the region in which a LOCOS oxide film is to be formed) to form a LOCOS oxide film 2 made of silicon oxide. During the above thermal oxidation, the silicon nitride film SN functions as a thermal oxidation-resistant film. Accordingly, a thermal oxide film is not formed and therefore, the LOCOS oxide film 2 is not formed in the region of the surface of the semiconductor substrate SUB (that is, the surface of the epitaxial layer EP) covered with the silicon nitride film SN. The LOCOS oxide film 2 is formed selectively (locally) in the region of the surface of the semiconductor substrate SUB (that is, the surface of the epitaxial layer EP) not covered with the silicon nitride film SN. Then, the silicon nitride film SN used as the thermal oxidation-resistant film is removed by etching or the like to obtain the state as shown in FIG. 7.

Figure 8:
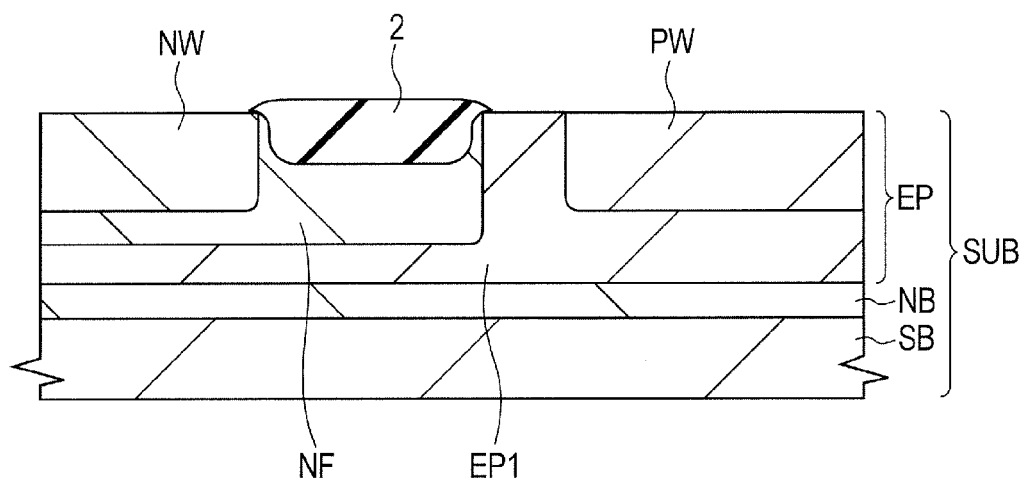
FIG. 8 is a fragmentary cross-sectional view of the semiconductor device during a manufacturing step following that of FIG. 7.

Next, as shown in FIG. 8, an n type semiconductor region NW, an n⁻ type semiconductor region NF, and a p type well are each formed in the semiconductor substrate SUB, more specifically, the epitaxial layer EP of the semiconductor substrate SUB by ion implantation.

The n type semiconductor region NW can be formed by introducing n type impurities into the epitaxial layer EP of the semiconductor substrate SUB by ion implantation. The n⁻ type semiconductor region NF can be formed by introducing n type impurities into the epitaxial layer EP of the semiconductor substrate SUB by ion implantation. The p type well PW can be formed by introducing p type impurities into the epitaxial layer EP of the semiconductor substrate SUB by ion implantation.

The n type semiconductor region NW and the n⁻ type semiconductor region NF have the same conductivity type, but the impurity concentration (n type impurity concentration) of the n type semiconductor region NW is higher than the impurity concentration (n type impurity concentration) of the n⁻ type semiconductor region NF. The impurity concentration (p type impurity concentration) of the p type well PW is higher than the impurity concentration (p type impurity concentration) of the p⁻ type epitaxial layer EP.

After formation of the n type semiconductor region NW, the n⁻ type semiconductor region NF, and the p type well PW, the n type semiconductor region NW is enclosed in the n⁻ type semiconductor region NF and the bottom surface and the side surface of the n type semiconductor region NW are adjacent (contiguous) to the n⁻ type semiconductor region NF. On the other hand, the p type well PW is separated from the n⁻ type semiconductor region NF.

The n type semiconductor region NW, the n⁻ type semiconductor region NF, and the p type well PW are formed by independent ion implantation. The n type semiconductor region NW, the n⁻ type semiconductor region NF, and the p type well PW are not necessarily formed in order of mention.

Next, an STI insulating film (STI isolation film) 3 is formed in the main surface of the semiconductor substrate SUB, that is, in the main surface of the epitaxial layer EP by STI method.

More specifically, the STI insulating film 3 can be formed, for example, as follows (FIGS. 9 to 14).

Figure 9:
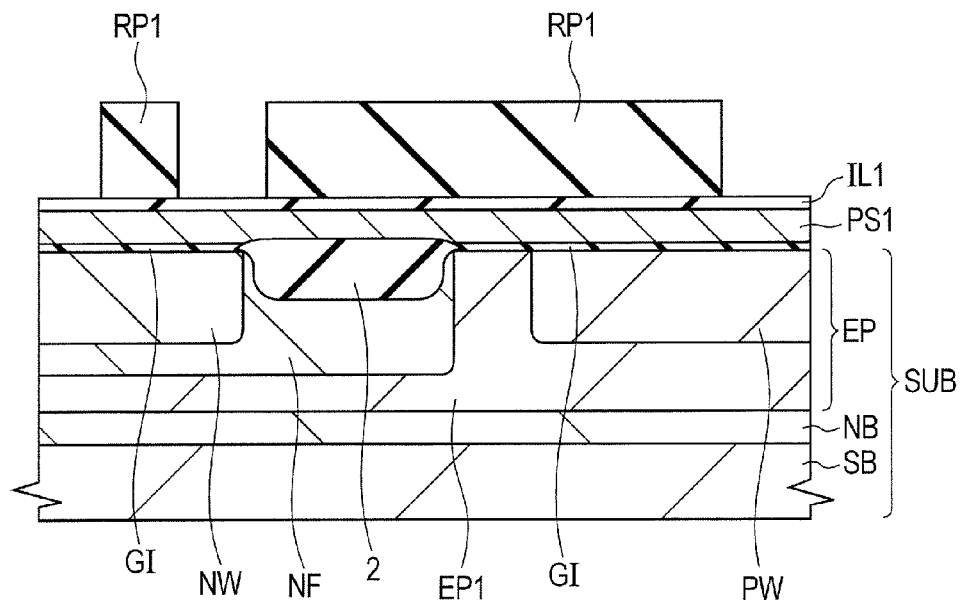
FIG. 9 is a fragmentary cross-sectional view of the semiconductor device during a manufacturing step following that of FIG. 8.

As shown in FIG. 9, an insulating film GI for gate insulating film is formed on the main surface of the semiconductor substrate SUB, that is, on the surface of the epitaxial layer EP. The insulating film GI is made of, for example, a silicon oxide film and can be formed by thermal oxidation method or the like. When the insulating film GI is formed by thermal oxidation method, the insulating film GI is formed on the surface of the epitaxial layer EP (including the n type semiconductor region NW, the n⁻ type semiconductor region NF, and the p type well PW) in a region having therein no LOCOS oxide film 2.

Then, a silicon film PS1 is formed (deposited) on the main surface of the semiconductor substrate SUB, that is, on the insulating film GI and the LOCOS oxide film 2. The silicon film PS1 is made of a polycrystalline silicon film (polysilicon film) and can be formed by CVD (chemical vapor deposition) or the like. It can also be obtained by forming an amorphous silicon film as the silicon film PS1 and then carrying out heat treatment to convert the silicon film PS1 made of the amorphous silicon film into the silicon film PS1 made of a polycrystalline silicon film. As the silicon film PS1, a low-resistance semiconductor film (doped polysilicon film) formed by introducing impurities during film formation or introducing impurities after film formation by ion implantation can also be used.

Then, an insulating film IL1 is formed (deposited) on the main surface of the semiconductor substrate SUB, that is, on the silicon film PS1. The insulating film IL1 is made of a silicon nitride film and can be formed by CVD or the like.

Figure 10:
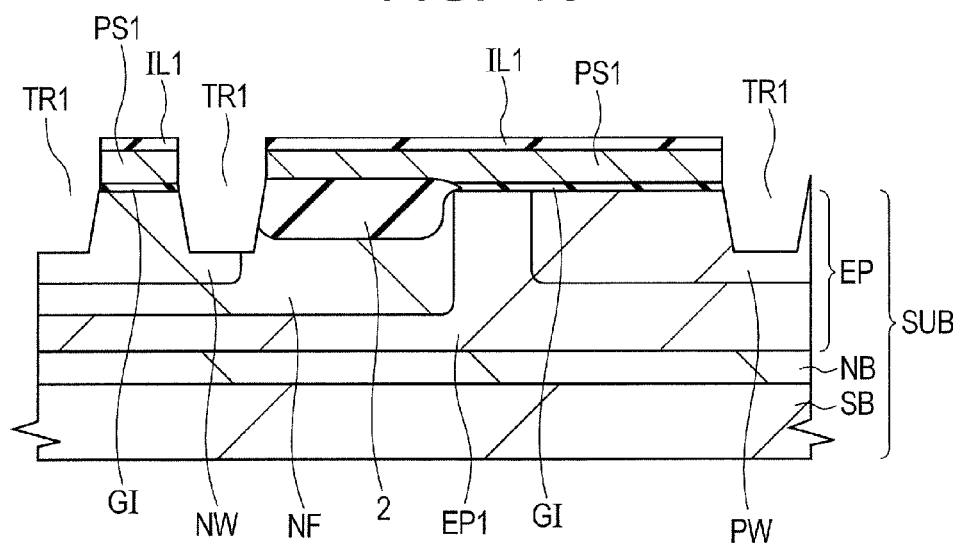
FIG. 10 is a fragmentary cross-sectional view of the semiconductor device during a manufacturing step following that of FIG. 9.

Then, a photoresist layer (photoresist pattern) RP1 is formed on the insulating film IL1 by photolithography. FIG. 9 shows this stage. Then, as shown in FIG. 10, with the photoresist layer RP1 as an etching mask, the insulating film IL1, the silicon film PS1, the insulating film GI, and the epitaxial layer EP are etched to form a trench TR1. The trench TR1 penetrates through the insulating film IL1, the silicon film PS1, and the insulating film GI and the bottom portion of the trench TR1 is present in the middle of the thickness of the epitaxial layer EP. Then, the photoresist layer RP1 is removed. FIG. 10 shows this stage.

Here, described is formation of the trench TR1 by etching the insulating film L1, the silicon film PS1, the insulating film GI, and the epitaxial layer EP with the photoresist layer RP1 as an etching mask. As another embodiment, the trench TR1 can also be formed by etching the insulating film IL1 with the photoresist layer RP1 as an etching mask, removing the photoresist layer RP1 and then, etching the silicon film PS1, the insulating film GI, and the epitaxial layer EP with the insulating film IL1 as an etching mask (hard mask).

Figure 11:
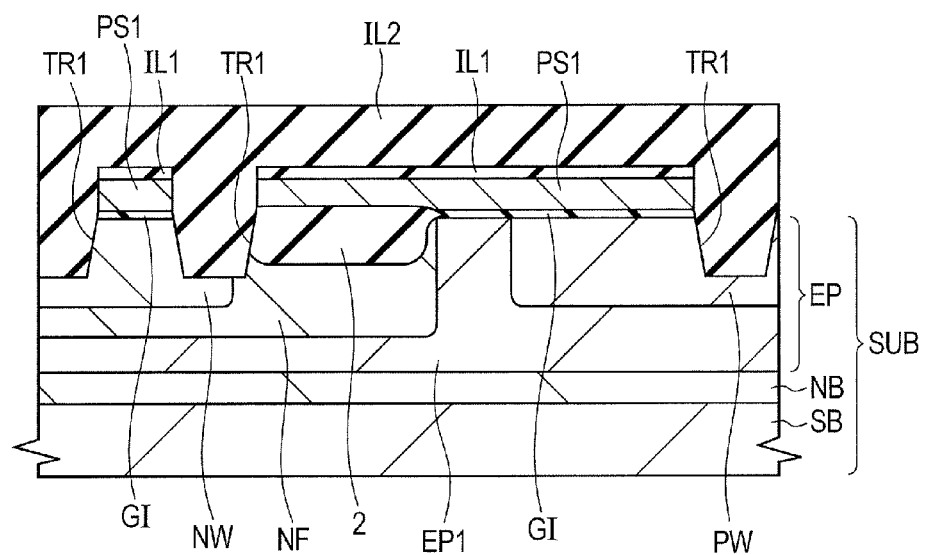
FIG. 11 is a fragmentary cross-sectional view of the semiconductor device during a manufacturing step following that of FIG. 10.

Then, as shown in FIG. 11, an insulating film IL2 is formed (deposited) on the main surface of the semiconductor substrate SUB, that is, on the insulating film IL1 so as to fill the trench TR1. The insulating film IL2 is made of, for example, a silicon oxide film and can be formed by CVD or the like. This insulating film IL2 is an insulating film for forming the STI insulating film 3.

Figure 12:
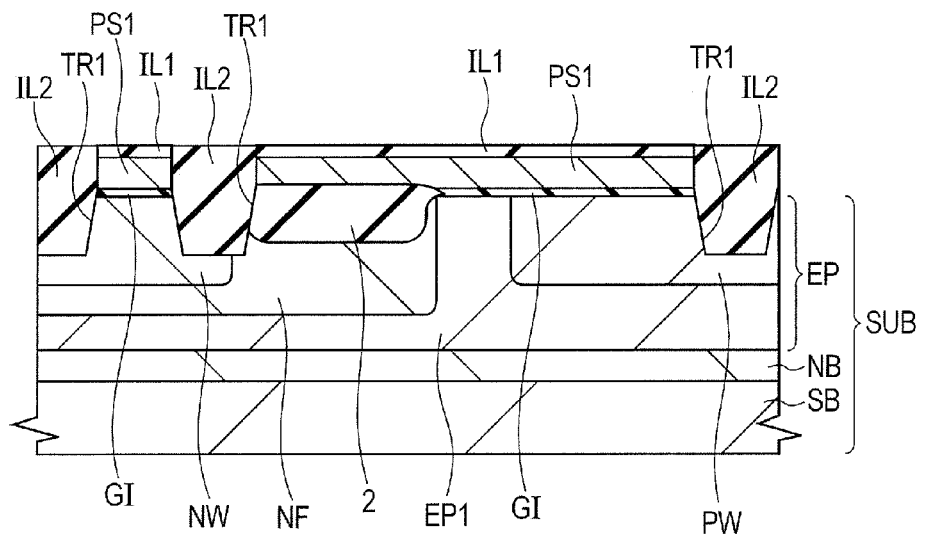
FIG. 12 is a fragmentary cross-sectional view of the semiconductor device during a manufacturing step following that of FIG. 11.

Then, as shown in FIG. 12, the insulating film IL2 outside the trench TR1 is removed by CMP (chemical mechanical polishing) or the like.

Figure 13:
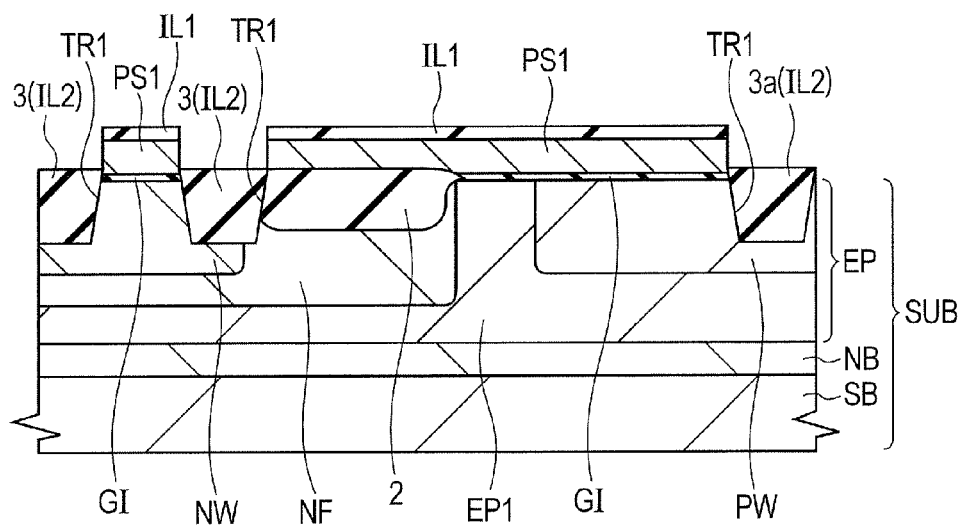
FIG. 13 is a fragmentary cross-sectional view of the semiconductor device during a manufacturing step following that of FIG. 12.

Then, as shown in FIG. 13, the insulating film IL2 is etched back to remove a portion of the insulating film IL2 sandwiched by a stacked film of the insulating film IL1 and the silicon film PS1 in plane direction. This etchback can be carried out, for example, by wet etching. This etchback is preferably performed under conditions (etching conditions) under which the insulating film IL1 and the silicon film PS1 are etched more difficulty than the insulating film IL2. In other words, this etchback is preferably performed under conditions (etching conditions) under which the respective etching rates of the insulating film IL1 and the silicon film PS1 are made smaller than the etching rate of the insulating film IL2. This makes it possible, in this etchback step, to selectively remove a portion of the insulating film IL2 sandwiched by the stacked film of the insulating film IL1 and the silicon film PS1 in plane direction while suppressing or preventing etching of the insulating film IL1 and the silicon film PS1. In this etchback step, a portion of the insulating film IL2 buried in the trench TR1 formed in the epitaxial layer EP is left without removal. After completion of the etchback step, therefore, the height of the upper surface of the insulating film IL2 is almost equal to that of the upper surface of the LOCOS oxide film 2 or the upper surface of the insulating film GI.

The insulating film IL1 and the insulating film IL2 are made of respectively different insulating materials. This makes it possible to differentiate the etching rate of the insulating film IL1 from the etching rate of the insulating film IL2 in the etchback step of the insulating film IL2. Further, in the etchback step of the insulating film IL2, an etch selectivity to the insulating film IL2 is preferably made higher than that to the insulating film IL1. From this standpoint, it is preferred to use a silicon nitride film as the insulating film IL1 and a silicon oxide film as the insulating film IL2.

Figure 14:
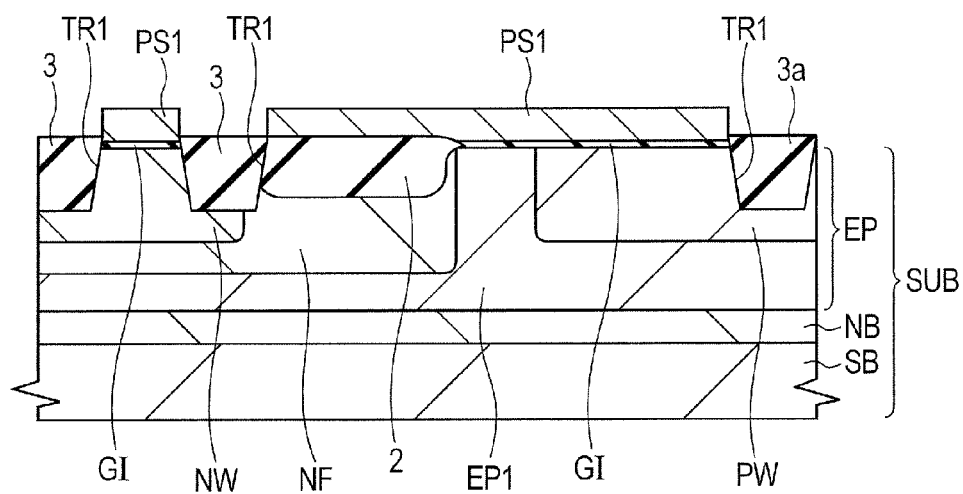
FIG. 14 is a fragmentary cross-sectional view of the semiconductor device during a manufacturing step following that of FIG. 13.

Then, as shown in FIG. 14, the insulating film IL1 is removed by etching or the like.

In such a manner, the STI insulating film 3 made of the insulating film IL2 buried in the trench TR1 of the epitaxial layer EP is formed. The trench TR1 formed in the epitaxial layer EP of the semiconductor substrate SUB is filled with the insulating film IL2 and the insulating film IL2 buried in the trench TR1 of the epitaxial layer EP serves as the STI insulating film 3. The upper surface of the STI insulating film 3 has a height almost equal to that of the upper surface of the LOCOS oxide film 2 or the upper surface of the insulating film GI.

An STI insulating film 3a for element isolation can be formed together with the STI insulating film 3 for drain isolation. This means that the STI insulating film 3a and the STI insulating film 3 are formed in one step. Similar to the STI insulating film 3, the STI insulating film 3a is also made of the insulating film IL2 buried in the trench TR1 formed in the semiconductor substrate SUB. The STI insulating film 3a is formed in a region in which the element isolation region 4 is to be formed. A DTI structure 5 which will be described later is formed at a position where this STI insulating film 3a is formed.

Figure 15:
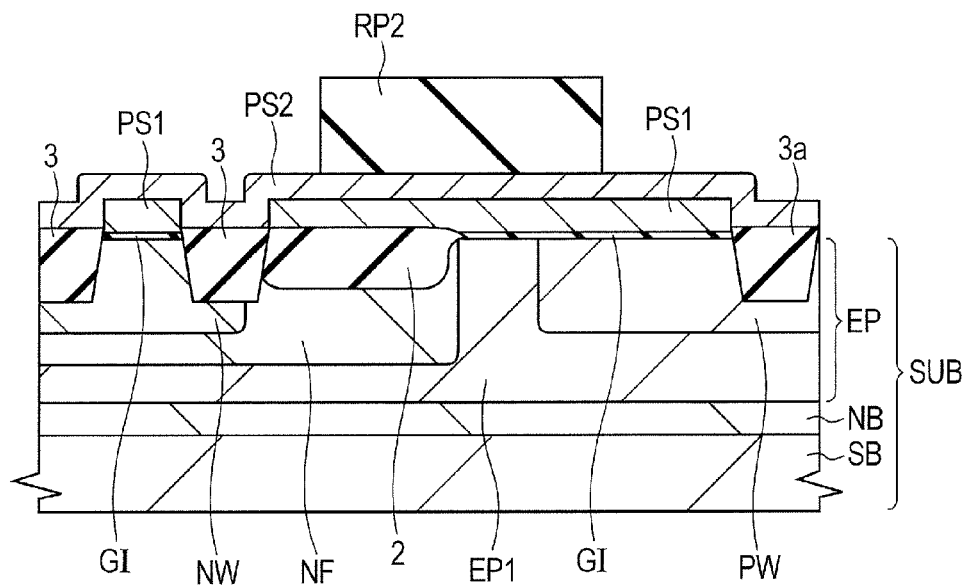
FIG. 15 is a fragmentary cross-sectional view of the semiconductor device during a manufacturing step following that of FIG. 14.

Next, as shown in FIG. 15, a silicon film PS2 is formed (deposited) on the main surface of the semiconductor substrate SUB, that is, on the epitaxial layer EP so as to cover therewith the LOCOS oxide film 2, the STI insulating films 3 and 3a, and the silicon film PS1. The silicon film PS2 is made of a polycrystalline silicon film and can be formed by CVD or the like. Upon film formation, after formation of an amorphous silicon film as the silicon film PS2, heat treatment can be performed to convert the silicon film PS2 made of the amorphous silicon film into the silicon film PS2 made of a polycrystalline silicon film. As the silicon film PS2, a low-resistance semiconductor film (doped polysilicon film) obtained by introducing impurities upon film formation or by introducing impurities after film formation by ion implantation can be used.

Figure 16:
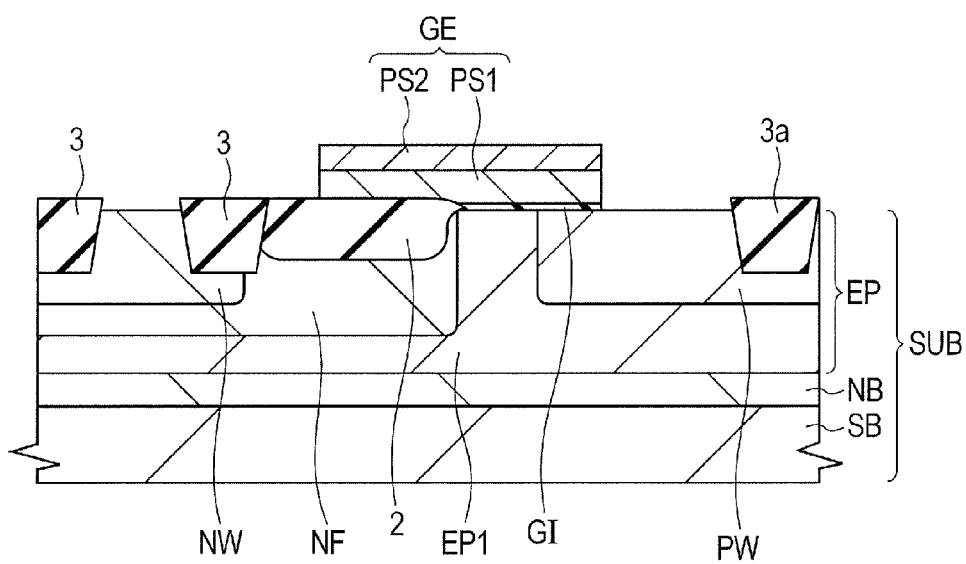
FIG. 16 is a fragmentary cross-sectional view of the semiconductor device during a manufacturing step following that of FIG. 15.

Next, a photoresist layer (photoresist pattern) RP2 is formed on the silicon film PS2 by photolithography. The photoresist layer RP2 is formed in a region where a gate electrode GE is to be formed. FIG. 15 shows this stage. With this photoresist layer RP2 as an etching mask, the silicon film PS2 and the silicon film PS1 are then patterned by etching (preferably dry etching) to form a gate electrode GE as shown in FIG. 16. The gate electrode GE is made of patterned silicon films PS1 and PS2. In other words, the gate electrode GE is made of a stacked film of the silicon film PS1 and the silicon film PS2 on the silicon film PS1 and the silicon film PS1 configuring the gate electrode GE and the silicon film PS2 configuring the gate electrode GE have almost the same plane shape. The photoresist layer RP2 is thereafter removed. FIG. 16 shows this stage.

The gate electrode GE is formed on the semiconductor substrate SUB, that is, on the epitaxial layer EP, via the insulating film GI. A portion of the insulating film GI other than that covered with the gate electrode GE can be removed by dry etching performed in the patterning step of the silicon films PS1 and PS2 or by this dry etching, followed by wet etching.

The gate electrode GE is formed on the epitaxial layer EP of the semiconductor substrate SUB via the insulating film GI but a portion of the gate electrode GE lies on the LOCOS oxide film 2. This means that the gate electrode GE has, as one body, a portion formed on the epitaxial layer EP via the insulating film GI and a portion located on the LOCOS oxide film 2. The insulating film GI is not necessarily formed on the LOCOS oxide film 2 when the insulating film GI is formed and in this case, a portion of the gate electrode GE located on the LOCOS oxide film 2 may be contiguous to the LOCOS oxide film 2.

Figure 17:
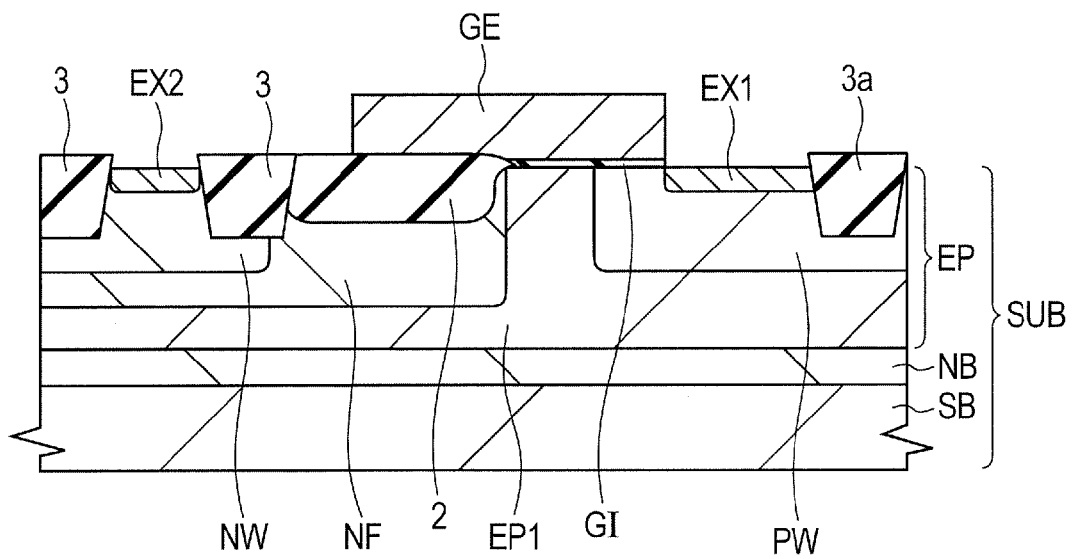
FIG. 17 is a fragmentary cross-sectional view of the semiconductor device during a manufacturing step following that of FIG. 16.

Next, as shown in FIG. 17, an $n^-$ type semiconductor region EX1 is formed in the semiconductor substrate SUB, more specifically, in the p type well PW of the epitaxial layer EP of the semiconductor substrate SUB by ion implantation. The $n^-$ type semiconductor region EX1 can be formed, for example, by introducing n type impurities such as arsenic (As) or phosphorus (P) into the epitaxial layer EP of the semiconductor substrate SUB through ion implantation, with the gate electrode GE as a mask (ion implantation-preventing mask). During this ion implantation, the gate electrode GE functions as a mask (ion implantation preventing mask) so that the $n^-$ type semiconductor region EX1 is formed in self alignment with the sidewall (side wall on the source side) of the gate electrode GE. The $n^-10$ type semiconductor region EX1 is formed so that it is enclosed in the p type well PW. During ion implantation for forming the $n^-$ type semiconductor region EX1, an $n^-$ type semiconductor region EX2 may be formed by implanting n type impurities into a region of the epitaxial layer EP where an $n^+$ type semiconductor region DR is to be formed.

Figure 18:
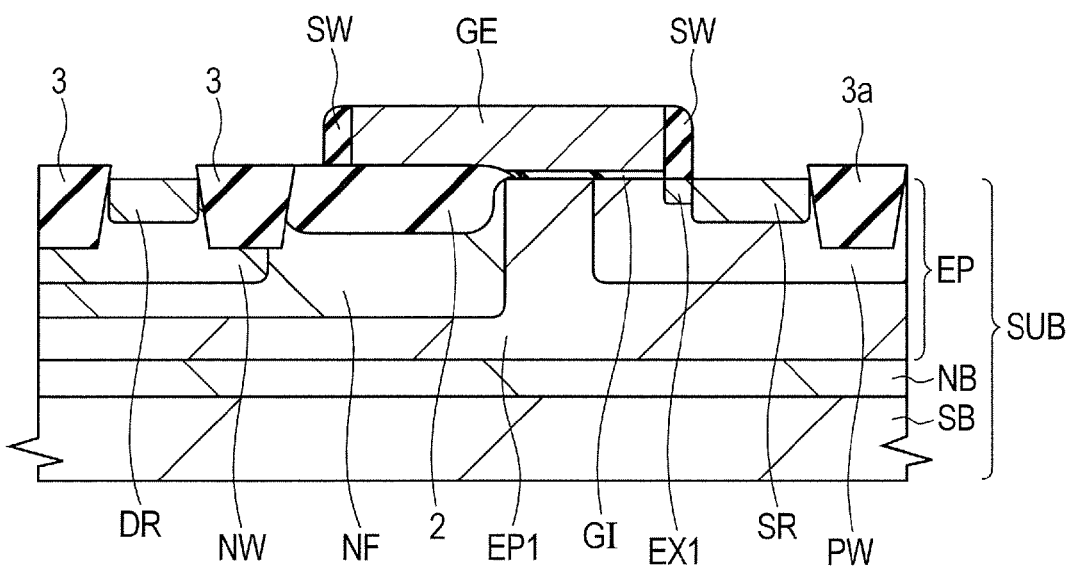
FIG. 18 is a fragmentary cross-sectional view of the semiconductor device during a manufacturing step following that of FIG. 17.

Next, as shown in FIG. 18, sidewall spacers (sidewalls, sidewall insulating films) SW made of an insulating film are formed on the side walls of the gate electrode GE, respectively. The sidewall spacers SW can be regarded as a sidewall insulating film.

More specifically, the sidewall spacers SW can be formed as follows. First, an insulating film for forming sidewall spacers SW is formed (deposited) on the whole main surface of the semiconductor substrate SUB so as to cover therewith the gate electrode GE. This insulating film is made of, for example, a silicon oxide film or a silicon nitride film, or a stacked film thereof and can be formed by CVD or the like. Then, the resulting insulating film is etched back by anisotropic etching. As a result, this insulating film (that is, the insulating film for forming sidewall spacers SW) remains selectively on the sidewalls of the gate electrode GE as the sidewall spacers SW.

Next, an $n^+$ type semiconductor region SR, an $n^+$ type semiconductor region DR, and a $p^+$ type semiconductor region PR are formed in the semiconductor substrate SUB, more specifically, in the epitaxial layer EP of the semiconductor substrate SUB by ion implantation or the like.

The $n^+$ type semiconductor region SR can be formed, for example, by introducing n type impurities such as arsenic (As) or phosphorus (P) into an upper portion of the p type well PW of the epitaxial layer EP by ion implantation. In the ion implantation for forming the $n^+$ type semiconductor region SR, the gate electrode GE and the sidewall spacers SW on the sidewalls thereof function as a mask (ion implantation preventing mask) so that the $n^+$ type semiconductor region SR is formed in self alignment with the sidewall spacer SW on the sidewall of the gate electrode GE. The $n^+$ type semiconductor region SR is formed so as to be enclosed in the p type well PW. The $n^+$ type semiconductor region SR has an impurity concentration (n type impurity concentration) higher and a depth greater than those of the $n^-$ type semiconductor region EX1, but it has a depth smaller than that of the p type well PW. The $n^+$ type semiconductor region DR can be formed by introducing n type impurities such as arsenic (As) or phosphorus (P) into an upper portion of the n type semiconductor region NW of the epitaxial layer EP by ion implantation. The p+ type semiconductor region PR can be formed by introducing p type impurities such as boron (B) into an upper portion of the p type well PW of the epitaxial layer EP by ion implantation. The p+ type semiconductor region PR is formed so as to be enclosed in the p type well PW but the p+ type semiconductor region PR and the n+ type semiconductor region SR are formed in regions respectively different from each other in plan view. The p+ type semiconductor region PR and the n+ type semiconductor region SR can be contiguous to each other, but they may be separated from each other via the p type well PW. The p+ type semiconductor region PR has an impurity concentration (n type impurity concentration) higher and a depth greater than those of the p type well PW.

FIG. 18 shows a section crossing the n+ type semiconductor region SR but not crossing the p+ type semiconductor region PR so that FIG. 18 does not show the p+ type semiconductor region PR. A section crossing the p+ type semiconductor region PR as in FIG. 2 shows the p+ type semiconductor region PR.

The n+ type semiconductor region SR and the n+ type semiconductor region DR have the same conductivity type so that they can be formed by the same ion implantation step but can also be formed by respectively different ion implantation steps. The p+ type semiconductor region PR has a conductivity type different from that of the n+ type semiconductor region SR and the n+ type semiconductor region DR so that it is formed by an ion implantation step different from that employed for the formation of the n+ type semiconductor region SR and the n+ type semiconductor region DR.

By the ion implantation for forming the n+ type semiconductor region DR, n type impurities are implanted at a high concentration into, in plan view, the plane region same as the region having therein the n− type semiconductor region EX2. When the n+ type semiconductor region DR is formed, the region having therein the n− type semiconductor region EX2 becomes a portion of the n+ type semiconductor region DR. The impurity concentration (n type impurity concentration) of the n+ type semiconductor region DR is higher than the impurity concentration (n type impurity concentration) of the n− type semiconductor region EX2. The depth of the n+ type semiconductor region DR is greater than the depth of the n− type semiconductor region EX2.

The n+ type semiconductor region SR and the n− type semiconductor region EX1 configure a source region of a LDD structure. When the n− type semiconductor region EX1 is formed, formation of the n+ type semiconductor region SR permits insertion of the n− type semiconductor region EX1 having an impurity concentration lower than that of the n+ type semiconductor region SR between the n+ type semiconductor region SR and the channel formation region and the n− type semiconductor region EX1 is located below the sidewall spacers SW.

Formation of the n− type semiconductor region EX1 or the n− type semiconductor region EX2 is not always necessary. After FIG. 19, therefore, the n− type semiconductor region EX1 is not shown. Alternatively, the n− type semiconductor region EX1 can be regarded as a portion of the n+ type semiconductor region SR which is a source region. FIG. 1 may embrace the case where the n− type semiconductor region EX1 is formed, that is, the n+ type semiconductor region SR for source contains the n− type semiconductor region EX1.

Next, activation annealing is performed as heat treatment for activating the introduced (implanted) impurities.

Next, a metal silicide layer SL is formed. Described specifically, the metal silicide layer SL can be formed as follows.

Figure 19:
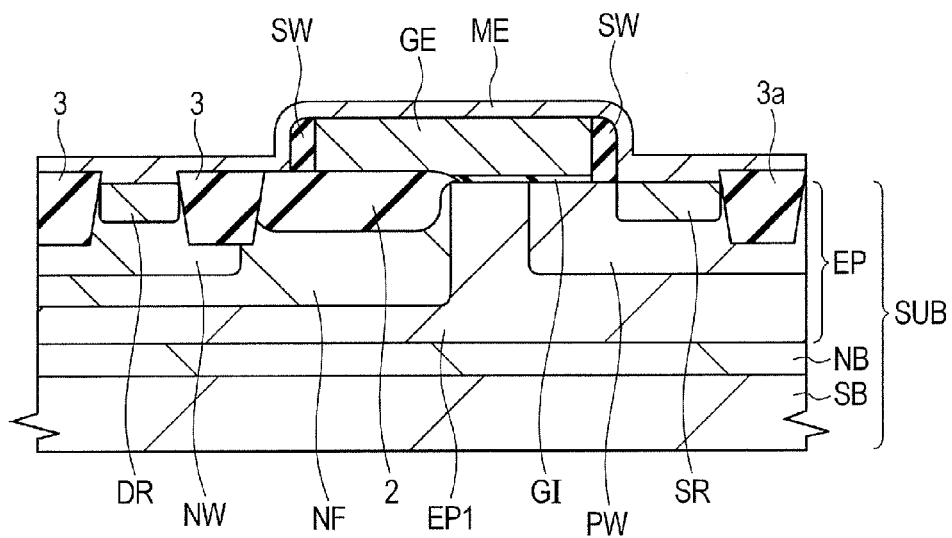
FIG. 19 is a fragmentary cross-sectional view of the semiconductor device during a manufacturing step following that of FIG. 18.

First, as shown in FIG. 19, a metal film ME is formed (deposited) on the whole main surface of the semiconductor substrate SUB including the upper surfaces (surfaces) of the n+ type semiconductor region DR, the n+ type semiconductor region SR, the p+ type semiconductor region PR, and the gate electrode GE so as to cover therewith the gate electrode GE and the sidewall spacer SW. The metal film ME may be a single metal film (pure metal film) or an alloy film, preferably a cobalt (Co) film, a nickel (Ni) film, or a nickel platinum alloy film. The metal film ME can be formed by sputtering or the like. Then, heat treatment is given to the semiconductor substrate SUB to cause reaction between the metal film ME and an upper layer portion (surface layer portion) of each of the n+ type semiconductor region DR, the n+ type semiconductor region SR, the p+ type semiconductor region PR, and the gate electrode GE. As a result, as shown in FIG. 20, a metal silicide layer SL is formed on an upper portion (upper surface, surface, upper layer portion) of each of the n+ type semiconductor region DR, the n+ type semiconductor region SR, the p+ type semiconductor region PR, and the gate electrode GE. The metal silicide layer SL may be, for example, a cobalt silicide layer (when the metal film ME is a cobalt film), a nickel silicide layer (when the metal film ME is a nickel film), or a platinum-added nickel silicide layer (when the metal film ME is a nickel platinum alloy film). The platinum-added nickel silicide layer is a platinum-added nickel silicide layer, that is, platinum-containing nickel silicide layer and it can also be called "nickel platinum silicide layer". Then, an unreacted portion of the metal film ME is removed by wet etching or the like. FIG. 20 shows this stage. The removal of the unreacted portion of the metal film ME may be followed by heat treatment.

Thus, by carrying out a so-called salicide (self aligned silicide) process, the metal silicide layer SL is formed on the upper portion of the n+ type semiconductor region DR, the n+ type semiconductor region SR, the p+ type semiconductor region PR, and the gate electrode GE, whereby diffusion resistance or contact resistance can be reduced. By using the salicide process, the metal silicide layer SL can be formed in self alignment on each of the n+ type semiconductor region DR, the n+ type semiconductor region SR, the p+ type semiconductor region PR, and the gate electrode GE. It is to be noted that formation of the metal silicide layer SL may be omitted.

Figure 20:
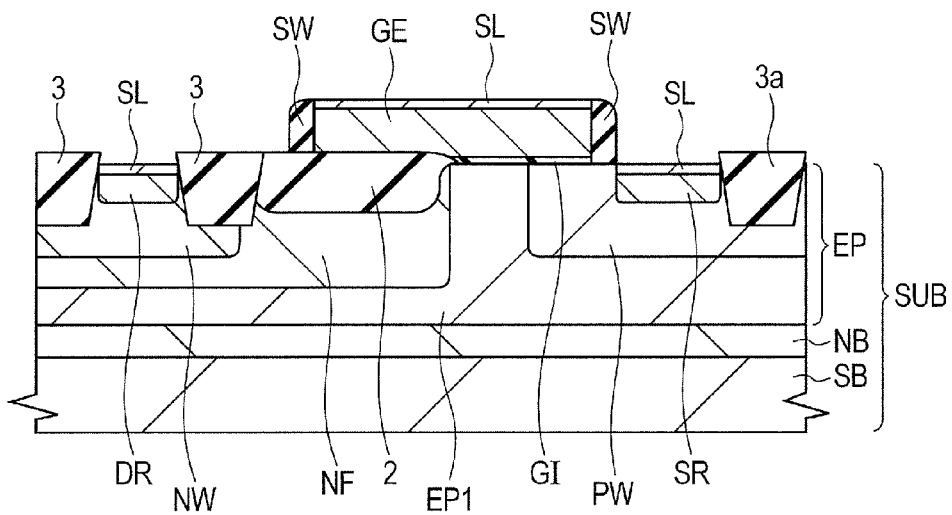
FIG. 20 is a fragmentary cross-sectional view of the semiconductor device during a manufacturing step following that of FIG. 19.

Also in FIGS. 1 and 2, as shown in FIG. 20, the metal silicide layer SL may be formed on the upper portion of the n+ type semiconductor region DR, the n+ type semiconductor region SR, the p+ type semiconductor region PR, and the gate electrode GE.

Figure 21:
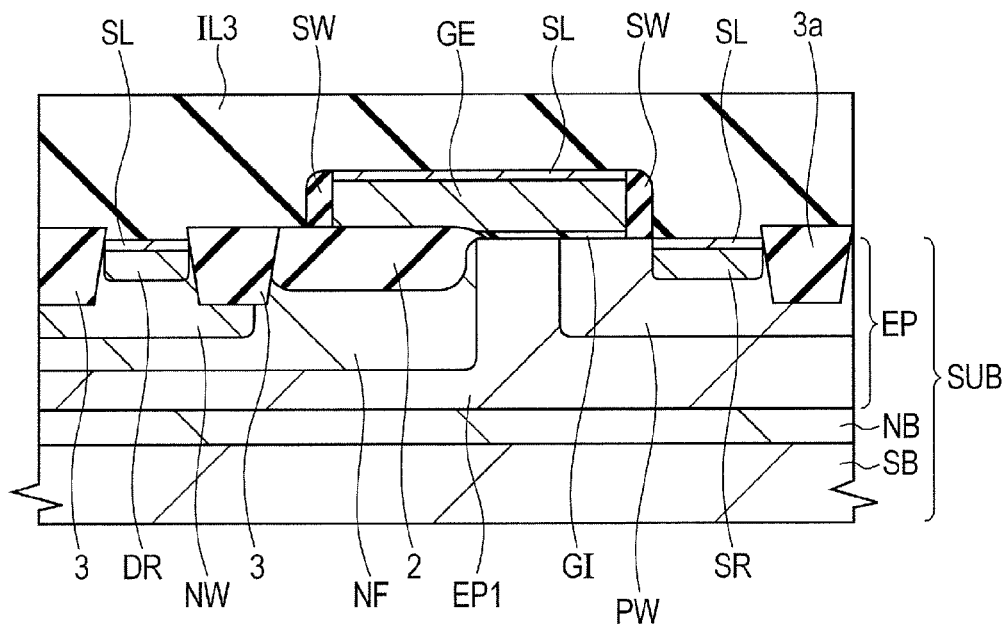
FIG. 21 is a fragmentary cross-sectional view of the semiconductor device during a manufacturing step following that of FIG. 20.

Next, as shown in FIG. 21, an insulating film IL3 is formed as an interlayer insulating film on the main surface (whole main surface) of the semiconductor substrate SUB. The insulating film IL3 is made of, for example, a silicon oxide film and can be formed by CVD or the like. As the insulating film IL3, a stacked insulating film may be used. The insulating film IL3 can have enhanced flatness, for example, by polishing, after formation of the insulating film IL3, the upper surface of the insulating film IL3 by CMP.

Figure 22:
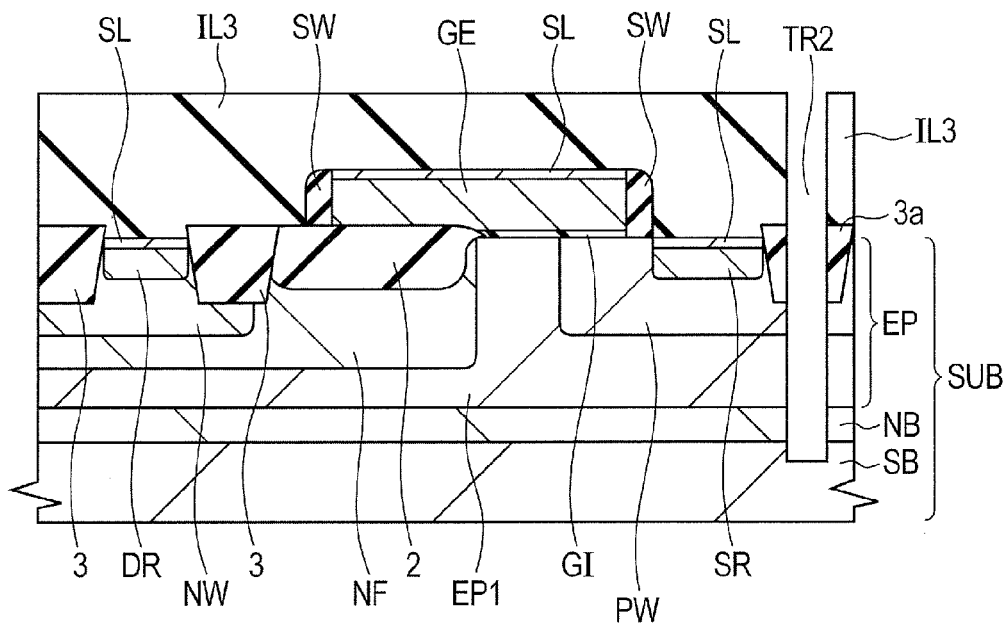
FIG. 22 is a fragmentary cross-sectional view of the semiconductor device during a manufacturing step following that of FIG. 21.

Next, as shown in FIG. 22, a trench TR2 is formed. This trench TR2 is formed at a position overlapping with the STI insulating film 3a in plan view. It penetrates through the insulating film IL3, the STI insulating film 3a, the epitaxial layer EP, and the buried layer NB and reaches the substrate body SB. This means that the bottom portion of the trench TR2 is located in the middle of the thickness of the substrate body SB. The trench TR2 can be formed, for example, by forming a photoresist layer (not illustrated) on the insulating film IL3 by photolithography and then, with this photoresist layer as an etching mask, etching the insulating film IL3, the STI insulating film 3a, and the semiconductor substrate SUB. Then, the photoresist layer is removed.

Figure 23:
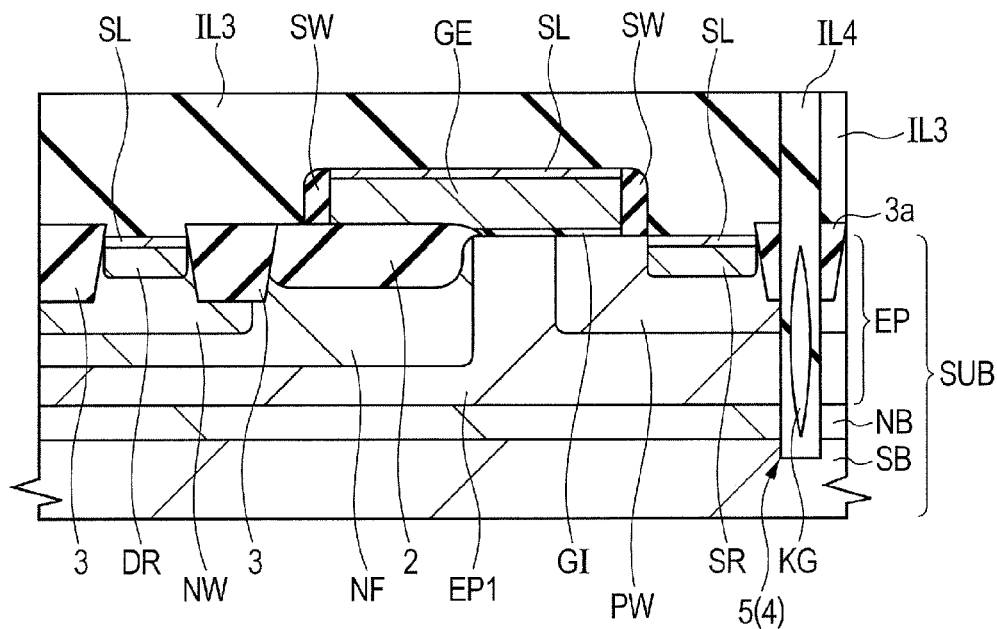
FIG. 23 is a fragmentary cross-sectional view of the semiconductor device during a manufacturing step following that of FIG. 22.

Next, as shown in FIG. 23, an insulating film IL4 is formed on the main surface of the semiconductor substrate SUB, that is, on the insulating film IL3 and also in the trench TR2. The insulating film IL4 is made of a silicon oxide film. The insulating film IL4 is formed so as not to completely fill the trench TR2 with the insulating film IL4, more specifically, it is formed in the trench TR2 so as to make a cavity (hollow, void, space) KG in the insulating film IL4 that fills the trench TR2. The cavity KG is a space (closed space) not having a material of the insulating film IL4 in the insulating film IL4 and the cavity KG is surrounded with an insulating material configuring the insulating film IL4.

Next, the insulating film IL4 is polished by CMP to remove the insulating film IL4 outside the trench TR2 and leave the insulating film IL4 in the trench TR2. By the insulating film IL4 and the cavity KG in the trench TR2, a DTI (deep trench isolation) structure 5 is formed. FIG. 23 shows this stage.

In FIG. 23, polishing by CMP is performed until exposure of the insulating film IL3 and the insulating film IL4 outside the trench TR2 is completely removed. In another embodiment, polishing of the insulating film IL4 can be terminated prior to exposure of the insulating film IL3. In this case, the insulating film IL4 remains in layer form on the insulating film IL3 even outside the trench TR2.

In the semiconductor substrate SUB, the DTI structure 5 can be formed so as to surround the periphery of a plane region (LDMOSFET formation region) having therein a plurality of LDMOSFET cells (corresponding to the above-mentioned unit LDMOSFETs 6a). This means that the element isolation region 4 shown in FIGS. 3 and 4 can be formed by the DTI structure 5. This leads to complete electrical isolation of the LDMOSFET formation region from another region.

Figure 24:
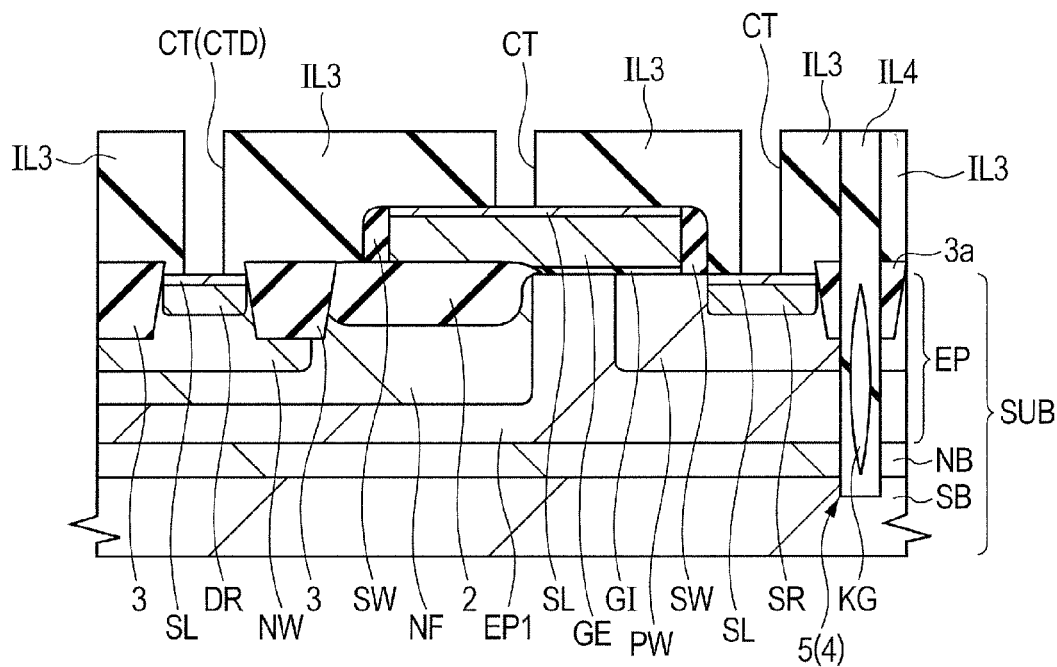
FIG. 24 is a fragmentary cross-sectional view of the semiconductor device during a manufacturing step following that of FIG. 23.

Next, as shown in FIG. 24, contact holes CT are made in the insulating film IL3. The contact holes CT can be formed, for example, by forming a photoresist layer (not illustrated) on the insulating film IL3 by photolithography and with this photoresist layer as an etching mask, dry etching the insulating film IL3. The contact holes CT penetrate through the insulating film IL3.

Figure 25:
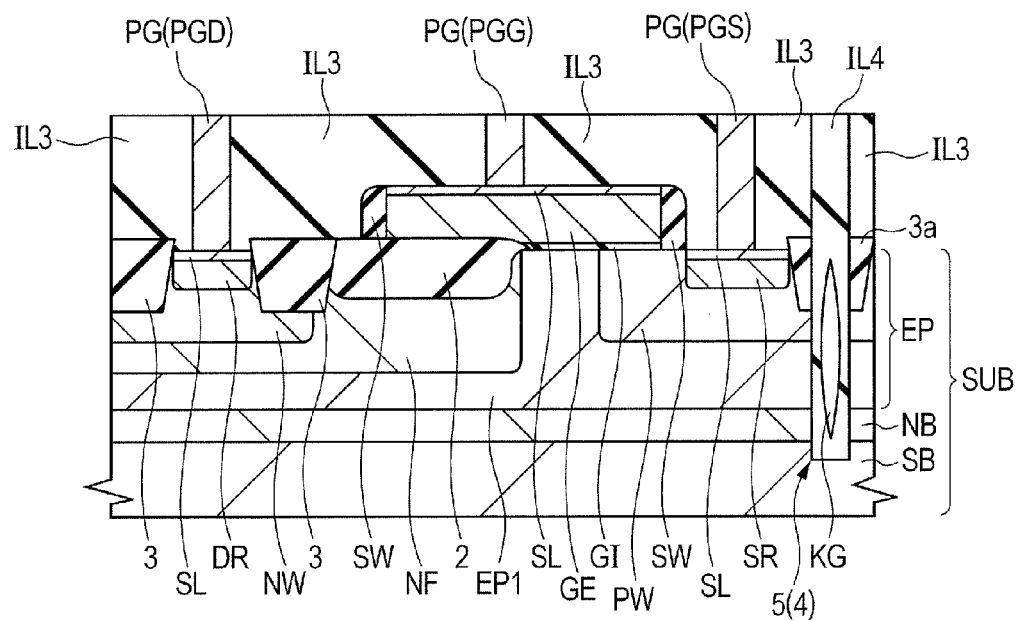
FIG. 25 is a fragmentary cross-sectional view of the semiconductor device during a manufacturing step following that of FIG. 24.

Next, as shown in FIG. 25, a conductive plug PG made of, for example, tungsten (W) is formed as a coupling conductor portion in the contact holes CT.

The plug PG is formed, for example, as follows. First, a barrier conductor film is formed on the insulating film IL3 and also in the contact holes CT (on the bottom portion and sidewall thereof). The barrier conductor film is made of, for example, a titanium film or a titanium nitride film, or a stacked film thereof. Then, a main conductor film made of a tungsten film or the like is formed on the barrier conductor film so as to fill the contact holes CT. Then, an unnecessary portion of the main conductor film and the barrier conductor film outside the contact holes CT is removed by CMP or etchback to form a plug PG made of the main conductor film and the barrier conductor film which have buried and remained in the contact holes CT. To simplify the drawing, the barrier conductor film and the main conductor film configuring the plug PG is shown as one body in FIG. 25.

The contact holes CT and the plugs PG therein are formed over the $n^+$ type semiconductor region DR, the $n^+$ type semiconductor region SR, the $p^+$ type semiconductor region PR, and the gate electrode GE, respectively. From the bottom portion of the contact hole CT formed over the $n^+$ type semiconductor region DR, the metal silicide layer SL on the $n^+$ type semiconductor region DR is exposed and the drain plug PGD buried in the contact hole CT is contiguous and electrically coupled to the metal silicide layer SL on the $n^+$ type semiconductor region DR, whereby it is electrically coupled to the $n^+$ type semiconductor region DR. From the bottom portion of the contact hole CT formed over the $n^+$ type semiconductor region SR, the metal silicide layer SL on the $n^+$ type semiconductor region SR is exposed and the source plug PGS buried in the contact hole CT is contiguous and electrically coupled to the metal silicide layer SL on the $n^+$ type semiconductor region SR, whereby it is electrically coupled to the $n^+$ type semiconductor region SR. From the bottom portion of the contact hole CT formed over the $p^+$ type semiconductor region PR, the metal silicide layer SL on the $p^+$ type semiconductor region SR is exposed and the power supply plug PGK buried in the contact hole CT is contiguous and electrically coupled to the metal silicide layer SL on the $p^+$ type semiconductor region PR, whereby it is electrically coupled to the $p^+$ type semiconductor region PR. From the bottom portion of the contact hole CT formed over the gate electrode GE, the metal silicide layer SL on the gate electrode GE is exposed and the gate plug PGS buried in the contact hole CT is contiguous and electrically coupled to the metal silicide layer SL on the gate electrode GE, whereby it is electrically coupled to the gate electrode GE.

Figure 26:
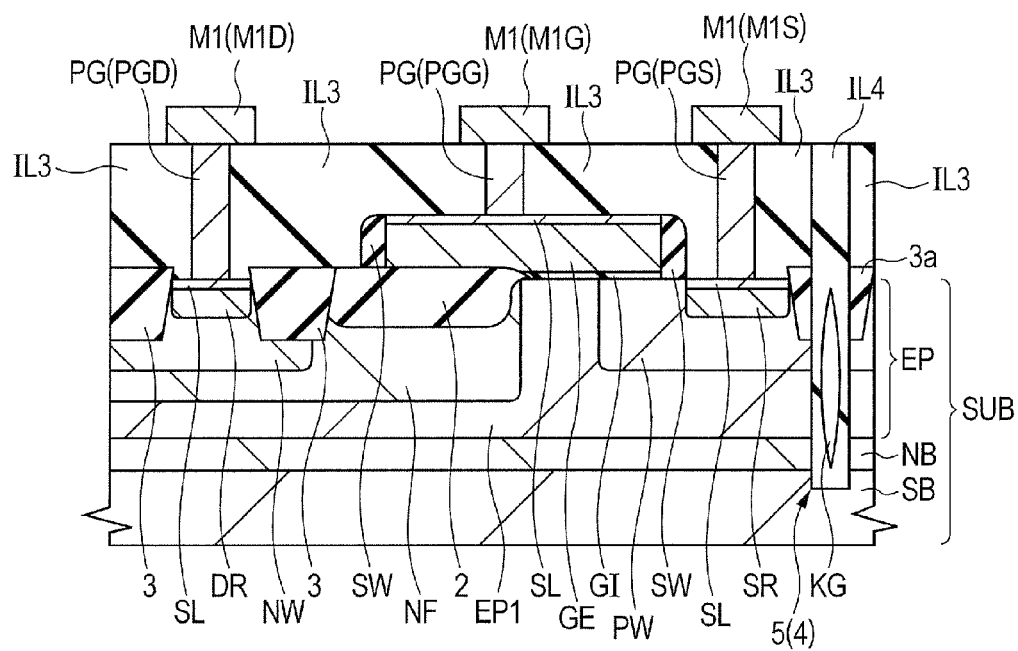
FIG. 26 is a fragmentary cross-sectional view of the semiconductor device during a manufacturing step following that of FIG. 25.

Next, as shown in FIG. 26, a wiring M1 which is a first-layer wiring is formed on the insulating film IL3 filled with the plug PG.

The wiring M1 can be formed, for example, as follows. Described specifically, first, a stacked conductive film composed of a barrier conductor film, a main conductor film, and a barrier conductor film and obtained by stacking them one after another in order of mention is formed on the insulating film IL3 filled with the plug PG. The barrier conductor film is made of, for example, a titanium film or a titanium nitride film, or a stacked film thereof and the main conductor film is made of, for example, a conductor film (aluminum film or aluminum alloy film) composed mainly of aluminum. The stacked conductive film is then patterned by photolithography and dry etching to form a wiring M1 made of a patterned stacked conductive film. In FIG. 26, the barrier conductor film and the main conductor film of the wiring M1 are shown as one body in order to simplify the drawing. The wiring M1 is electrically coupled to, via the plug PG, the $n^+$ type semiconductor region DR, the $n^+$ type semiconductor region SR, the $p^+$ type semiconductor region PR, the gate electrode GE, or the like.

Next, as shown in FIG. 27, an insulating film IL5 is formed as an interlayer insulating film on the insulating film IL3 so as to cover the wiring M1. The insulating film IL5 is made of, for example, a silicon oxide film and can be formed by CVD or the like. A stacked insulating film may be used as the insulating film IL5. After formation of the insulating film IL5, the upper surface of the insulating film IL5 may be polished by CMP to enhance the flatness of the insulating film 115.

Next, a through-hole (opening portion, through-bore) is formed in the insulating film IL5. This through-hole can be formed, for example, by dry etching the insulating film IL5 with a photoresist layer (not illustrated) formed on the insulating film IL5 by photolithography as an etching mask.

From the bottom portion of the through-hole formed in the insulating film IL5, the upper surface of the wiring M1 is exposed.

Next, a conductive plug PG2 is formed as a coupling conductor portion in the through-hole formed in the insulating film IL5. The plug PG2 can be formed in a manner similar to that of the plug PG.

Next, a wiring M2, a second-layer wiring, is formed on the insulating film IL5 filled with the plug PG2. The wiring M2 can be formed in a manner similar to that of the wiring M1.

The plug PG2 is, at the bottom surface thereof, contiguous and electrically coupled to the wiring M1 and is, at the upper surface, contiguous and electrically coupled to the wiring M2. The wiring M2 is therefore electrically coupled to the wiring M1 via the plug PG2.

Next, an insulating film IL6 is formed as an interlayer insulating film on the insulating film IL5 so as to cover the wiring M2. The insulating film IL6 can have enhanced flatness, for example, by polishing, after formation of the insulating film IL6, the upper surface of the insulating film IL6 by CMP or the like.

Next, a through-hole is formed in the insulating film IL6. The through-hole in the insulating film IL6 can be formed in a manner similar to that of the through-hole in the insulating film IL5. From the bottom portion of the through-hole in the insulating film IL6, an upper surface of the wiring M2 is exposed.

Next, in the through-hole formed in the insulating film IL6, a conductive plug PG3 is formed as a coupling conductor portion. The plug PG3 can be formed in a manner similar to that of the plug PG2.

Next, a wiring M3, that is, a third-layer wiring is formed on the insulating film IL6 filled with the plug PG3. The wiring M3 can be formed in a manner similar to that of the wiring M2.

The plug PG3 is, at the bottom surface thereof, contiguous and electrically coupled to the wiring M2 and is, at the upper surface, contiguous and electrically coupled to the wiring M3. The wiring M3 is therefore electrically coupled to the wiring M2 via the plug PG3.

Next, an insulating film IL7 is formed as an interlayer insulating film on the insulating film IL6 so as to cover the wiring M3. After formation of the insulating film IL7, the upper surface of the insulating film IL7 is polished by CMP or the like to enhance the flatness of the insulating film IL7.

Next, a through-hole is formed in the insulating film IL7. The through-hole in the insulating film IL7 can be formed in a manner similar to that of the through-hole in the insulating film IL6. From the bottom portion of the through-hole in the insulating film IL7, the upper surface of the wiring M3 is exposed.

Next, a conductive plug PG4 is formed, as a coupling conductor portion, in the through-hole formed in the insulating film IL7. The plug PG4 can be formed in a manner similar to that of the plug PG3.

Next, a wiring M4, that is, a fourth-layer wiring is formed on the insulating film IL7 filled with the plug PG4. The wiring M4 can be formed in a manner similar to that of the wiring M3.

The plug PG 4 is, at the bottom surface thereof, contiguous and electrically coupled to the wiring M3 and is, at the upper surface, contiguous and electrically coupled to the wiring M4. The wiring M4 is therefore electrically coupled to the wiring M3 via the plug PG4.

Next, as shown in FIG. 28, after formation of, as a protective film, an insulating film IL8 made of a silicon nitride film or the like on the insulating film IL7, an opening portion OP1 exposing therefrom a portion of the wiring M4 is formed in the insulating film IL8 by photolithography and etching. Then, a photosensitive resin film IL9 made of a polyimide film or the like is applied (formed) onto the insulating film IL8 and also in the opening portion OP1, followed by exposure and development of the resin film IL9 to form an opening portion OP2 in the resin film IL9. In plan view, the opening portion OP2 in the resin film IL9 includes the opening portion OP1 of the insulating film IL8. A portion of the wiring M4 is therefore exposed from the opening portion OP2 in the resin film IL9 and the wiring M4 exposed from the opening portion OP2 in the resin film IL9 configures a bonding pad (pad electrode) functioning as an external coupling terminal.

As described above, the semiconductor device of the present embodiment is manufactured. Then, a dicing step is performed to separate the semiconductor substrates SUB into individual pieces.

Formation of four-layer wiring layers (wiring layers M1 to M4) have been described, but the number of wiring layers formed can be changed.

The plug PG and the wiring M1 can be formed as one body. In this case, the drain plug PGD and the drain wiring M1D are formed as one body; the gate plug PGG and the gate wiring M1G are formed as one body; and the source plug PGS and the power supply plug PGK and the source wiring M1S are formed as one body. The plug PG2 and the wiring M2 can be formed as one body; the plug PG3 and the wiring M3 can be formed as one body; and the plug PG4 and the wiring M4 can be formed as one body.

In the above description, the wirings M1 to M4 are formed by patterning a wiring conductive film but any of the wirings M1 to M4 and the plugs PG2 to PG4 may be formed by a damascene process. As the damascene process, either a single damascene process or a dual damascene process may be used.

<Study Example>

Examples studied by the present inventors will next be described referring to FIGS. 29 to 32.

Figure 29:
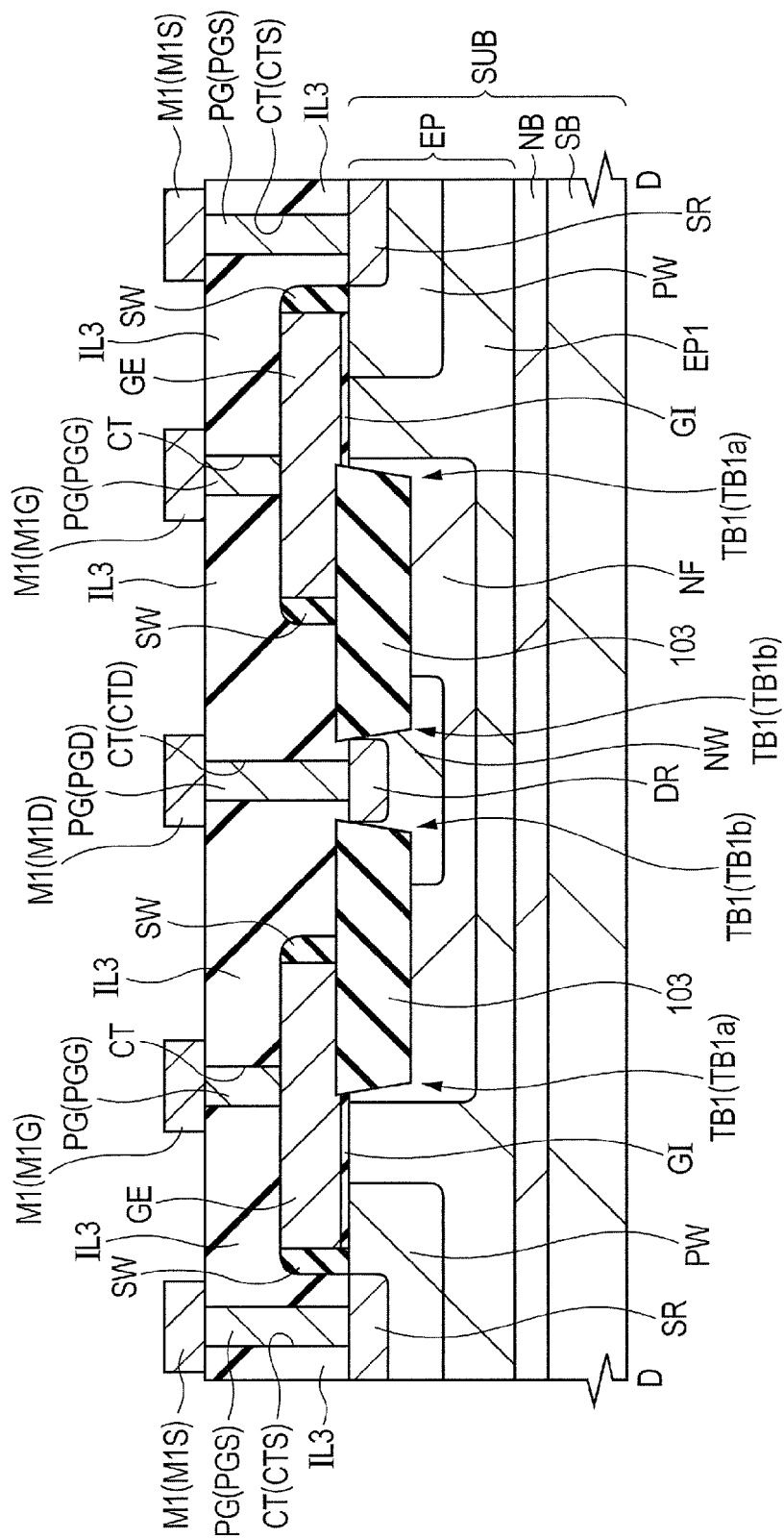
FIG. 29 is a fragmentary cross-sectional view of a semiconductor device according to a first study example.
Figure 30:
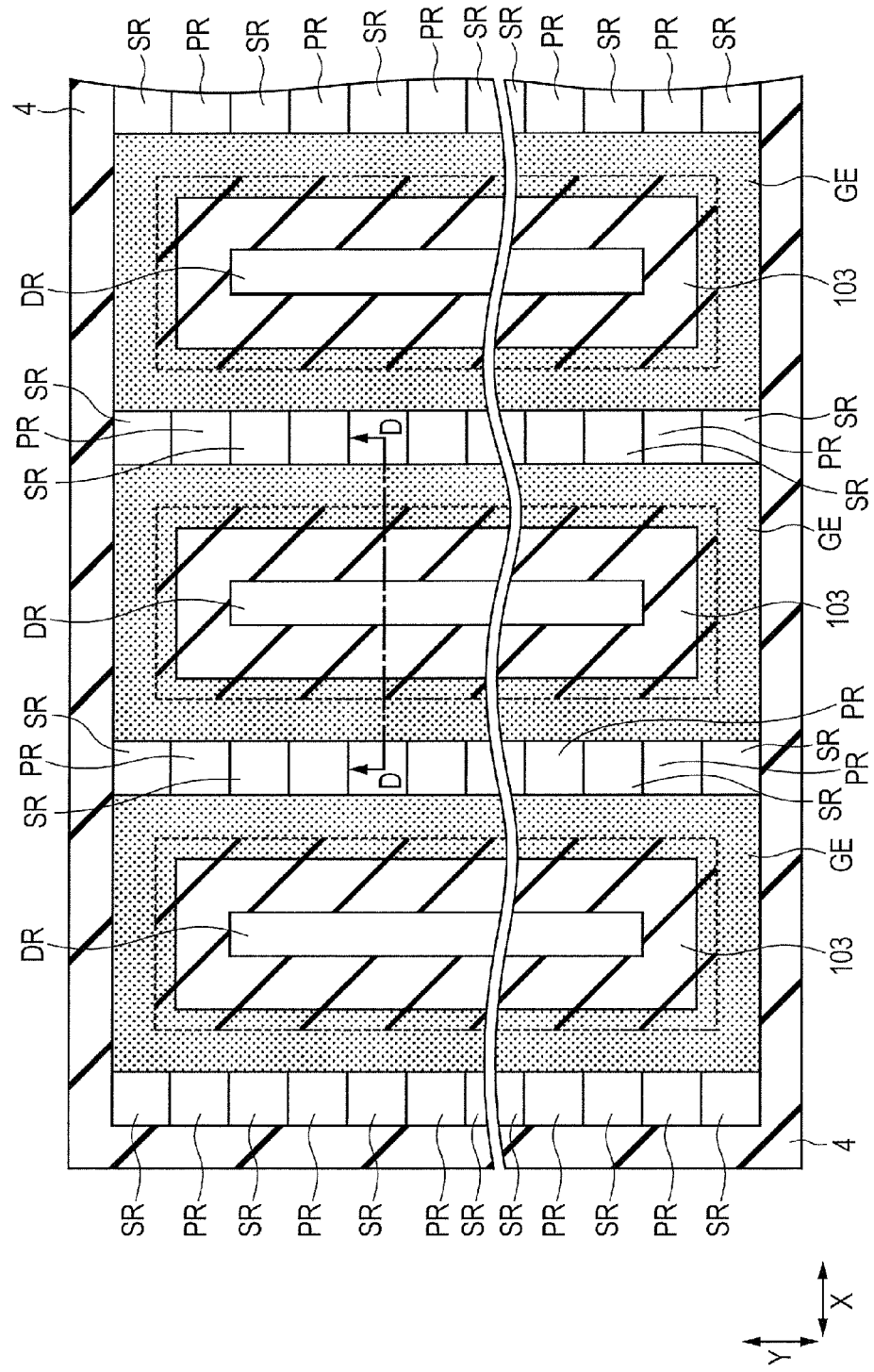
FIG. 30 is a fragmentary plan view of the semiconductor device according to the first study example.
Figure 31:
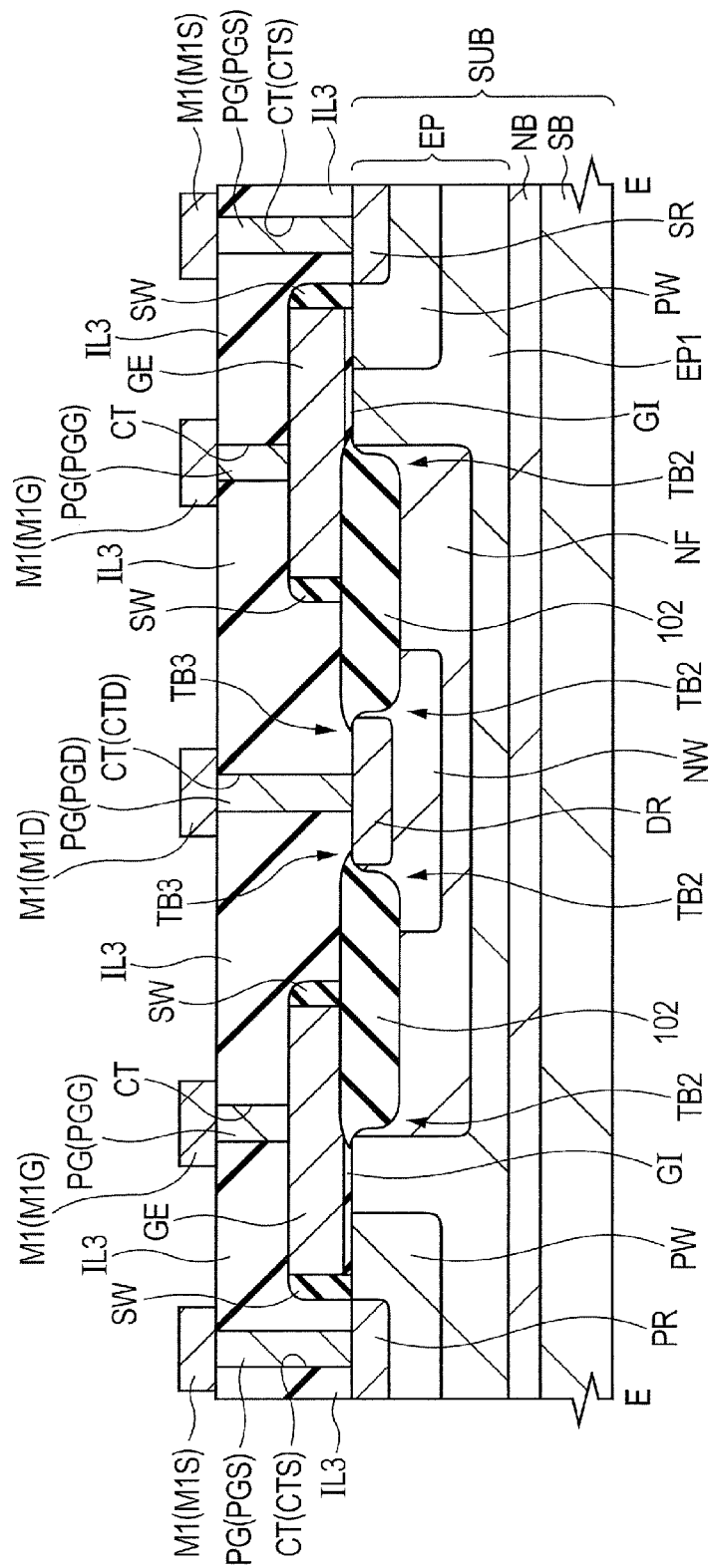
FIG. 31 is a fragmentary cross-sectional view of a semiconductor device according to a second study example.
Figure 32:
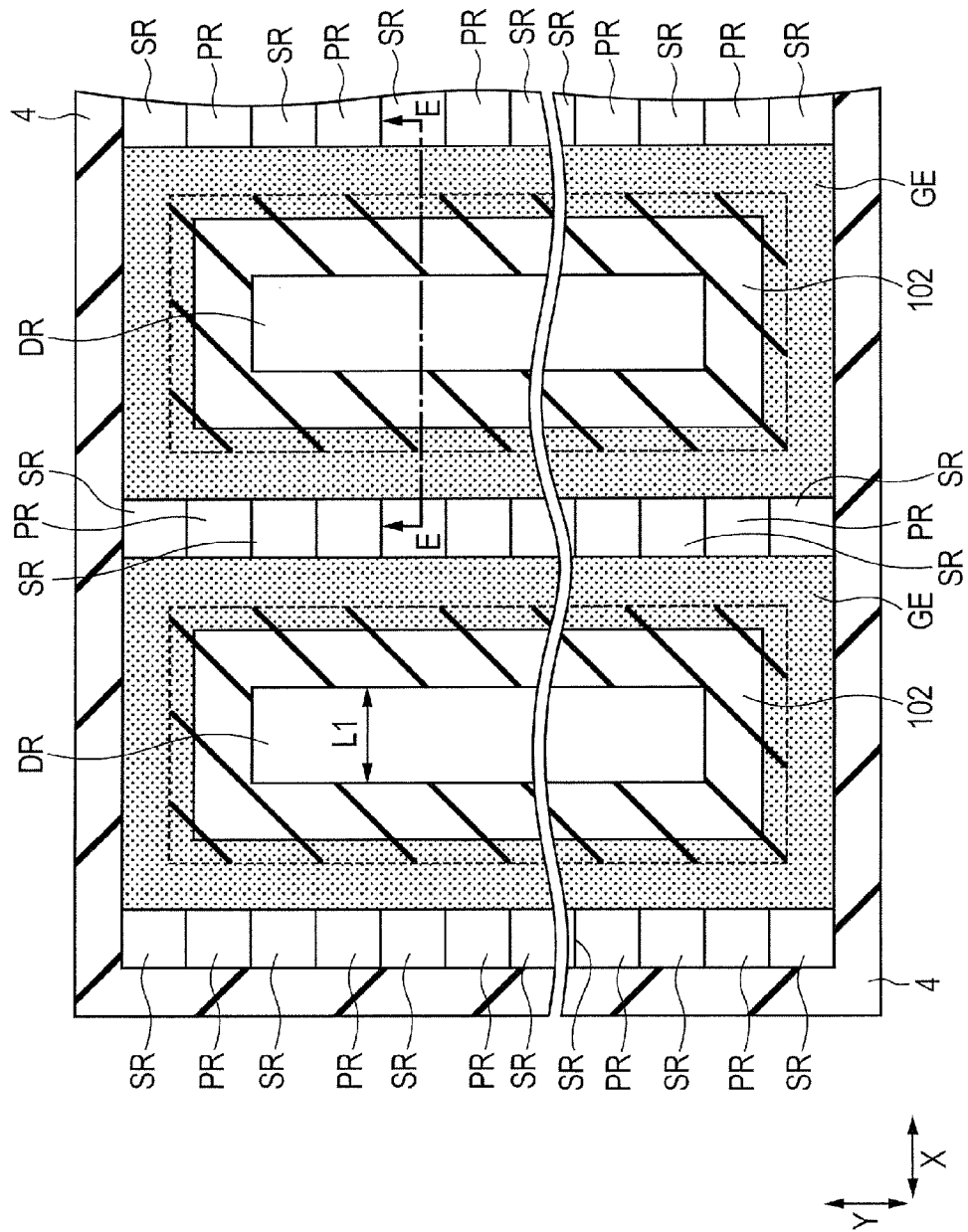
FIG. 32 is a fragmentary plan view of the semiconductor device according to the second study example.

FIG. 29 is a fragmentary cross-sectional view of a semiconductor device of a first study example studied by the present inventors and FIG. 30 is a fragmentary plan view of the semiconductor device of the first study example. The cross-sectional view taken along the line D-D of FIG. 30 substantially corresponds to FIG. 29. FIG. 31 is a fragmentary cross-sectional view of a semiconductor device of a second study example studied by the present inventors, and FIG. 32 is a fragmentary plan view of the semiconductor device of the second study example. The cross-sectional view taken along the line E-E of FIG. 32 substantially corresponds to FIG. 31. FIGS. 29 and 31 are cross-sectional views corresponding to FIG. 1, and FIGS. 30 and 32 are plan views corresponding to FIG. 4. FIGS. 30 and 32 are plan views but to facilitate understanding, a LOCOS oxide film 102, an STI insulating film 103, and an element isolation region 4 are hatched with diagonal lines and the gate electrode GE is hatched with dotted lines.

In the semiconductor device of the first study example shown in FIGS. 29 and 30, a channel formation region and an $n^+$ type semiconductor region DR for drain have therebetween an STI insulating film 103 in the main surface of a semiconductor substrate SUB and no LOCOS oxide film is formed therein. In the semiconductor device of the second study example shown in FIGS. 31 and 32, on the other hand, a channel formation region and an $n^+$ type semiconductor region DR for drain have therebetween a LOCOS oxide film 102 in the main surface of a semiconductor substrate SUB but no STI insulating film is formed therein.

This means that in the semiconductor device of the first study example shown in FIGS. 29 and 30, the STI insulating film 103 is substituted for the entirety of the LOCOS oxide film 2 and the STI insulating film 3 in the semiconductor device of the present embodiment shown in FIGS. 1 to 4. In the semiconductor device of the second study example shown in FIGS. 31 and 32, the LOCOS oxide film 102 is substituted for the entirety of the LOCOS oxide film 2 and the STI insulating film 3 in the semiconductor device of the present embodiment shown in FIGS. 1 to 4.

In other words, the semiconductor device of the present embodiment shown in FIGS. 1 to 4 uses both the LOCOS oxide film 2 and the STI insulating film 3 for drain isolation; the semiconductor device of the first study example shown in FIGS. 29 and 30 uses not a LOCOS oxide film but only the STI insulating film 103 for drain isolation; and the semiconductor device of the second study example shown in FIGS. 31 and 32 uses not an STI insulating film but the LOCOS oxide film 102 for drain isolation.

In the first study example shown in FIGS. 29 and 30, the channel formation region and the n$^+$ type semiconductor region DR for drain have therebetween the STI insulating film 103 in the main surface of the semiconductor substrate SUB. This makes it possible to isolate the n$^+$ type semiconductor region DR for drain from the channel formation region by the STI insulating film 103 so that the LDMOSFET thus obtained can have improved breakdown voltage (drain breakdown voltage).

It has, however, been revealed by the study by the present inventors that the semiconductor device of the first study example shown in FIGS. 29 and 30 has the following problem.

Described specifically, the STI insulating film 103 has a corner at lower-surface end portions thereof, and the corner is likely to become sharp. This reflects the formation of the STI insulating film 103 by STI method, in other words, formation of the STI insulating film 103 by filling a trench formed in the main surface of the semiconductor substrate SUB with an insulating film. An electric field is likely to concentrate on the lower-surface end portion TB1 of the STI insulating film 103. In the first study example shown in FIGS. 29 and 30, the lower-surface end portion TB1 of the STI insulating film 103 is also present on the side of the channel formation region. Among the lower-surface side end portions TB1 of the STI insulating film 103, the lower-surface end portion TB1 on the side of the channel formation region is marked with TB1$a$ and will hereinafter be called "lower-surface end portion TB1$a$" and the lower-surface end portion TB1 on the side of the n$^+$ type semiconductor region DR for drain is marked with TB1$b$ and will hereinafter be called "lower-surface end portion TB1$b$".

Due to electric field concentration to the lower-surface end portion TB1$a$ of the STI insulating film 103, hot carriers (impact ions) are generated and the resulting hot carriers may be implanted into the gate insulating film (that is, the insulating film GI between the gate electrode GE and the channel formation region) below the gate electrode GE. When the LDMOSFET is a p channel type MISFET, these hot carriers are electrons and when the LDMOSFET is an n channel type MISFET, these hot carriers are holes. Hot carriers implanted into the gate insulating film deteriorate the gate insulating film and thereby deteriorate the reliability of the gate insulating film. As a result, the semiconductor device thus obtained inevitably has deteriorated reliability. In addition, the semiconductor device has deteriorated performances. Deterioration of the gate insulating film due to hot carriers implanted therein may occur either when the LDMOSFET is an n channel type MISFET or when it is a p channel type MISFET, but deterioration is particularly severe when the LDMOSFET is a p channel type MISFET.

In the first study example shown in FIGS. 29 and 30, the STI insulating film 103 has a lower-surface end portion TB1 (that is, the lower-surface end portion TB1$b$) also on the side of the n$^+$ type semiconductor region DR for drain. Even when an electric field is concentrated to this lower-surface end portion TB1$b$ and hot carriers (impact ions) are generated, this lower-surface end portion TB1$b$ is distant from the gate insulating film below the gate electrode GE so that hot carriers generated at the lower-surface end portion TB1$b$ are not implanted into the gate insulating film and do not lead to deterioration in the gate insulating film.

Deterioration of the gate insulating film therefore occurs not by the sharp lower end portion TB1$b$ of the STI insulating film 103 on the side of the n$^+$ type semiconductor region DR for drain but by the sharp lower-surface end portion TB1$a$ of the STI insulating film 103 on the side of the channel formation region.

In the second study example shown in FIGS. 31 and 32, on the other hand, a lower-surface end portion TB2 of the LOCOS oxide film 102 is not sharp but round. In short, the lower-surface end portion TB2 of the LOCOS oxide film 102 has a round shape. It has such a shape because the LOCOS oxide film 102 is formed by LOCOS method, more specifically, the LOCOS oxide film 102 is formed by locally oxidizing (thermally oxidizing) the main surface of the semiconductor substrate SUB. Therefore, less electric field concentration occurs at the lower-surface end portion TB2 of the LOCOS oxide film 102 of the second study example shown in FIGS. 31 and 32 than at the lower-surface end portion TB1 of the STI insulating film 103 in the first study example shown in FIGS. 29 and 30.

In the second study example shown in FIGS. 31 and 32, electric field concentration is less likely to occur at the lower-surface end portion TB2 of the LOCOS oxide film 102 and generation of hot carriers (impact ions) is less likely to occur at the lower-surface end portion TB2 of the LOCOS oxide film 102. Therefore, a tendency of hot carriers, which have been generated at the lower-surface end portion TB2 of the LOCOS oxide film 102, being inevitably implanted into the gate insulating film (the insulating film GI) below the gate electrode GE is not likely to occur. Although, there is concern about a tendency of the gate insulating film being deteriorated due to hot carries generated by electric field concentration at the lower-surface end portion TB1$a$ of the STI insulating film 103 in the first study example shown in FIGS. 29 and 30, such concern can be resolved by using the LOCOS oxide film 102 instead of the STI insulating film 103 in the second study example shown in FIGS. 31 and 32.

It has however been revealed by the study by the present inventors that the semiconductor device of the second study example shown in FIGS. 31 and 32 has the following problem.

In the semiconductor device of the second study example shown in FIGS. 31 and 32, an upper-surface end portion TB3 of the LOCOS oxide film 102 is likely to have a bird's beak shape. This is attributable to using LOCOS method for the formation of the LOCOS oxide film 102, more specifically, formation of the LOCOS oxide film 102 by locally oxidizing (thermally oxidizing) the main surface of the semiconductor substrate SUB. During formation of a contact hole CT, the upper-surface end portion TB3 of the LOCOS oxide film 102 having a bird's beak shape may prevent smooth opening of a drain contact hole CTD. When the upper-surface end portion TB3 of the LOCOS oxide film 102 has a bird's beak shape and the bird's beak-shaped oxide film portion overlaps with the formation position of the drain contact hole CTD, the bird's beak-shaped oxide film portion may remain at the bottom portion of the drain contact hole CTD.

The remaining of the bird's beak-shaped oxide film portion at the bottom portion of the drain contact hole CTD may prevent successful exposure of the $n^+$ type semiconductor region DR for drain (or the metal silicide layer SL on the $n^+$ type semiconductor region DR) from the drain contact hole CTD and may therefore cause a coupling failure between the drain plug PGD and the $n^+$ type semiconductor region DR for drain. This inevitably leads to a reduction in production yield of the semiconductor device. In order to prevent it, the formation position of the drain contact hole CTD (formation position of the drain plug PGD) should be separated sufficiently from the upper-surface end portion TB3 of the LOCOS oxide film 102. When the formation position of the drain contact hole CTD is separated sufficiently from the upper-surface end portion TB3 of the LOCOS oxide film 102, even if the upper-surface end portion TB3 of the LOCOS oxide film 102 has a bird's beak shape, the bird's beak-shaped oxide film portion does not overlap with the formation position of the drain contact hole CTD and it poses no problem for the formation of the drain contact hole CTD. Separating the formation position of the drain contact hole CTD sufficiently from the upper-surface end portion TB3 of the LOCOS oxide film 102 however increases the plane size of the $n^+$ type semiconductor region DR for drain and therefore increases the size (area) of the semiconductor device. In other words, separating the formation position of the drain contact hole CTD sufficiently from the upper-surface end portion TB3 of the LOCOS oxide film 102 increase a size L1 of the $n^+$ type semiconductor region DR for drain shown in FIG. 32 and therefore increases the size (area) of the semiconductor device. This size L1 of the $n^+$ type semiconductor region DR for drain corresponds to the size of the $n^+$ type semiconductor region DR in the direction X (direction along the gate length direction of the gate electrode GE).

In the semiconductor device of the second study example shown in FIGS. 31 and 32, since the upper-surface end portion TB3 of the LOCOS oxide film 102 has a bird's beak shape, a decrease in the size L1 of the $n^+$ type semiconductor region DR for drain may cause a coupling failure between the drain plug PGD and the $n^+$ type semiconductor region DR for drain. On the other hand, increasing the size L1 of the $n^+$ type semiconductor region DR for drain increases the size (area) of the semiconductor device, though the coupling failure between the drain plug PGD and the $n^+$ type semiconductor region DR for drain can be prevented.

<Main Characteristics and Advantages>

The semiconductor device of the present embodiment has the semiconductor substrate SUB, the $n^+$ type semiconductor region SR for source and the $n^+$ type semiconductor region DR for drain formed in the surface layer portion of the semiconductor substrate SUB while being separated from each other, and the gate electrode GE formed on the main surface of the semiconductor substrate SUB between the $n^+$ type semiconductor region SR for source and the $n^+$ type semiconductor region DR for drain via the gate insulating film (the insulating film GI). The semiconductor device of the present embodiment further has the LOCOS oxide film 2 and the STI insulating film 3 formed in the main surface of the semiconductor substrate SUB between the channel formation region below the gate electrode GE and the $n^+$ type semiconductor region DR for drain. Of the LOCOS oxide film 2 and the STI insulating film 3, the LOCOS oxide film 2 is located on the side of the channel formation region and the STI insulating film 3 is located on the side of the $n^+$ type semiconductor region DR for drain.

One of the main characteristics of the semiconductor device of the present embodiment is that it has the LOCOS oxide film 2 and the STI insulating film 3 in the main surface of the semiconductor substrate SUB between the channel formation region and the $n^+$ type semiconductor region DR for drain. The other main characteristic of the semiconductor device of the present embodiment is that of the LOCOS oxide film 2 and the STI insulating film 3, the LOCOS oxide film 2 is located on the side of the channel formation region and the STI insulating film 3 is located on the side of the $n^+$ type semiconductor region DR for drain.

In short, the semiconductor device of the present embodiment uses both the LOCOS oxide film 2 and the STI insulating film 3 for drain isolation and at the same time, has the LOCOS oxide film 2 on the side of the channel formation region and the STI insulating film 3 on the side of the $n^+$ type semiconductor region DR for drain.

The semiconductor device of the present embodiment has, between the channel formation region and the $n^+$ type semiconductor region DR for drain, the LOCOS oxide film 2 and the STI insulating film 3 in the main surface of the semiconductor substrate SUB. This makes it possible to isolate (separate) between the $n^+$ type semiconductor region DR for drain and the channel formation region by the LOCOS oxide film 2 and the STI insulating film 3, thereby obtaining a LDMOSFET having an improved breakdown voltage (drain breakdown voltage).

It is important for the semiconductor device of the present embodiment to form not one but both of the LOCOS oxide film 2 and the STI insulating film 3 in the main surface of the semiconductor substrate SUB between the channel formation region and the $n^+$ type semiconductor region DR for drain; and locate the LOCOS oxide film 2 on the side of the channel formation region and locate the STI insulating film 3 on the side of the $n^+$ type semiconductor region DR for drain. The following is the reason of it.

As described above, in the first study example shown in FIGS. 29 and 30, the STI insulating film 103 has the lower-surface end portion TB1$a$ on the side of the channel formation region. In this first study example, when electric field concentration occurs at the lower-surface end portion TB1$a$ of the STI insulating film 103 and hot carriers are generated, the hot carriers are inevitably implanted into the gate insulating film below the gate electrode GE (that is, into the insulating film GI between the gate electrode GE and the channel formation region), which may cause deterioration of the gate insulating film.

In the present embodiment, on the other hand, the LOCOS oxide film 2 and the STI insulating film 3 are formed in the main surface of the semiconductor substrate SUB between the channel formation region and the $n^+$ type semiconductor region DR for drain; and of the LOCOS oxide film 2 and the STI insulating film 3, the LOCOS oxide film 2 is located on the side of the channel formation region and the STI insulating film 3 is located on the side of the $n^+$ type semiconductor region DR for drain. In the present embodiment, therefore, not the lower-surface end portion of the STI insulating film 3 but a lower-surface end portion TB5 of the LOCOS oxide film 2 is present on the side of the channel formation region. Similar to the lower-surface end portion TB2 of the LOCOS oxide film 102 in the second study example shown in FIGS. 31 and 32, the lower-surface end portion TB5 of the LOCOS oxide film 2 is not sharp but is round. In short, the lower-surface end portion TB5 of the LOCOS oxide film 2 is round. It has such a shape because the LOCOS oxide film 2 is formed by LOCOS method, more specifically, the LOCOS oxide film 2 is formed by locally oxidizing (thermally oxidizing) the main surface of the semiconductor substrate SUB. Electric field concentration is not likely to occur at the lower-surface end portion TB5 of the LOCOS oxide film 2 of the present embodiment compared with that at the lower-surface end portion TB1 of the STI insulating film 103 in the first study example shown in FIGS. 29 and 30.

Since in the present embodiment, electric field concentration is not likely to occur at the lower-surface end portion TB5 of the LOCOS oxide film 2, hot carriers (impact ions) are not likely to be generated at the lower-surface end portion TB5 of the LOCOS oxide film 2. Therefore, there hardly occurs a phenomenon of hot carriers generated at the lower-surface end portion TB5 of the LOCOS oxide film 2 being implanted into the gate insulating film below the gate electrode GE (that is, into the insulating film GI between the gate electrode GE and the channel formation region). In the first study example shown in FIGS. 29 and 30, there is a concern about a phenomenon of the gate insulating film being deteriorated due to implantation therein of hot carriers generated by the electric field concentration at the lower-surface end portion TB1$a$ of the STI insulating film 103, but such a concern can be eliminated in the present embodiment. In the present embodiment, therefore, the problem of the first study example shown in FIGS. 29 and 30 can be overcome.

In the present embodiment, the STI insulating film 3 is present on the side of the n$^+$ type semiconductor region DR for drain and the lower-surface end portion TB4 of this STI insulating film 3 is likely to become sharp. Such a shape is attributable to using STI method for the formation of the STI insulating film 3, more specifically, formation of the STI insulating film 3 by filling a trench formed in the main surface of the semiconductor substrate SUB with an insulating film. The lower-surface end portion TB4 of the STI insulating film 3 is likely to become sharper than the lower-surface end portion TB5 of the LOCOS oxide film 2. In other words, the lower-surface end portion TB5 of the LOCOS oxide film 2 is likely to become rounder than the lower-surface end portion TB4 of the STI insulating film 3. The STI insulating film 3 is separated from the channel formation region by a distance corresponding to the LOCOS oxide film 2 so that lower-surface end portion (TB4) of the STI insulating film 3 is separated from the gate insulating film below the gate electrode GE (that is, the insulating film GI between the gate electrode GE and the channel formation region) by a distance corresponding to the LOCOS oxide film 2. Even if electric field concentration occurs at the lower-surface end portion (TB4) of the STI insulating film 3 and hot carriers (impact ions) are generated, the hot carriers generated at the lower-surface end portion (TB4) of the STI insulating film 3 are not implanted into the gate insulating film and therefore do not deteriorate the gate insulating film.

In the present embodiment, thus, a deterioration phenomenon of the gate insulating film which will otherwise occur by hot carriers implanted thereinto can be prevented so that the semiconductor device thus obtained can have improved reliability and at the same time, can have improved performances.

In the present embodiment, the LOCOS oxide film 2 and the STI insulating film 3 are formed in the main surface of the semiconductor substrate SUB between the channel formation region and the n$^+$ type semiconductor region DR for drain; and of the LOCOS oxide film 2 and the STI insulating film 3, the LOCOS oxide film 2 is located on the side of the channel formation region and the STI insulating film 3 is located on the side of the n$^+$ type semiconductor region DR for drain. In the present embodiment, therefore, not the LOCOS oxide film 2 but the STI insulating film 3 is placed on the side of the n$^+$ type semiconductor region DR for drain. Not the upper-surface end portion of the LOCOS oxide film 2 but an upper-surface end portion TB6 of the STI insulating film 3 is adjacent to the n$^+$ type semiconductor region DR for drain.

Different from the LOCOS oxide film, the STI insulating film 3 is not likely to have a bird's beak shape at the upper-surface end portion thereof. More specifically, the LOCOS oxide film is likely to have a bird's beak shape at the upper-surface end portion thereof, while the STI insulating film is not likely to have a bird's beak shape at the upper-surface end portion thereof because the STI insulating film is formed by STI method, more specifically, by filling a trench formed in the main surface of the semiconductor substrate with an insulating film.

Therefore, the upper-surface end portion TB6 of the STI insulating film 3 adjacent to the n$^+$ type semiconductor region DR for drain is not likely to have a bird's beak shape. In the present embodiment, during formation of the drain contact hole CTD, it is therefore possible to prevent occurrence of a phenomenon of the bird's beak-shaped oxide film portion overlapping with the formation position of the drain contact hole CTD and thereby inhibiting opening of the drain contact hole CTD.

In the second study example shown in FIGS. 31 and 32, since the upper-surface end portion TB3 of the LOCOS oxide film 102 has a bird's beak shape, the bird's beak-shaped oxide film portion may overlap with the formation position of the drain contact hole CTD and inhibit opening of the drain contact hole CTD. In the present embodiment, on the other hand, not the LOCOS oxide film 2 but the STI insulating film 3 is placed on the side of the n$^+$ type semiconductor region DR for drain so that such a concern can be eliminated.

In the present embodiment, therefore, a coupling failure can be prevented which may occur between the drain plug PGD formed in the drain contact hole CTD and the n$^+$ type semiconductor region DR for drain. The semiconductor device thus obtained can therefore have improved reliability. In addition, a production yield of the semiconductor device can be improved.

In the present embodiment, not the LOCOS oxide film 2 but the STI insulating film 3 is placed on the side of the n$^+$ type semiconductor region DR for drain. This makes it possible to prevent an opening failure of the drain contact hole CTD and thereby bring the formation position of the drain contact hole CTD (accordingly, the formation position of the drain plug PGD) closer to the upper-surface end portion TB6 of the STI insulating film 3. In other words, even if the formation position of the drain contact hole CTD is brought closer to the upper-surface end portion TB6 of the STI insulating film 3, an opening failure of the drain contact hole CTD can be prevented and a coupling failure between the drain plug PGD and the n$^+$ type semiconductor region DR for drain can be prevented by placing not the LOCOS oxide film 2 but the STI insulating film 3 on the side of the n$^+$ type semiconductor region DR for drain. Bringing the formation position of the drain contact hole CTD closer to the upper-surface end portion TB6 of the STI insulating film 3 enables a reduction in the plane size of the $n^+$ type semiconductor region DR for drain and further, a reduction in the size (area) of the semiconductor device. If the formation position of the drain contact hole CTD can be brought closer to the upper-surface end portion TB6 of the STI insulating film 3, a size L2 of the $n^+$ type semiconductor region DR for drain shown in FIG. 3 can be reduced, leading to a reduction in size (area) of the semiconductor device. The present embodiment therefore succeeds in a reduction in the size (area) of the semiconductor device by placing not the LOCOS oxide film 2 but the STI insulating film 3 on the side of the $n^+$ type semiconductor region DR for drain. In addition, the number of the unit LDMOSFETs 6a to be placed in the LDMOSFET formation region can be increased without changing the area thereof so that if the area is the same, it is possible to reduce the on-state resistance of a power MISFET configured by coupling a plurality of the unit LDMOSFETs 6a in parallel. The size L2 of the $n^+$ type semiconductor region DR for drain corresponds to the size of the $n^+$ type semiconductor region DR in the direction X (direction along the gate length direction of the gate electrode GE).

In one example, in the second study example shown in FIGS. 31 and 32, the size L1 of the $n^+$ type semiconductor region DR for drain should be set at, for example, about 1.2 μm, while in the present embodiment shown in FIGS. 1 to 4, the size L2 of the $n^+$ type semiconductor region DR for drain can be reduced to, for example, about 0.3 μm. Compared with the second study example, the size of the unit cell 6 in the direction X can be reduced, for example, by about 0.9 μm. Thus, the semiconductor device thus obtained can have a reduced size (area).

Thus, in the present embodiment, the LOCOS oxide film 2 and the STI insulating film 3 are formed in the main surface of the semiconductor substrate SUB between the channel formation region and the $n^+$ type semiconductor region DR for drain; and of the LOCOS oxide film 2 and the STI insulating film 3, the LOCOS oxide film 2 is placed on the side of the channel formation region and the STI insulating film 3 is placed on the side of the $n^+$ type semiconductor region DR for drain. Placing the LOCOS oxide film 2 on the side of the channel formation region makes it possible to prevent the phenomenon of the gate insulating film being deteriorated by implantation of hot carriers thereinto. Therefore, the semiconductor device thus obtained can have improved reliability. In addition, the semiconductor device can have improved performances. Placing the STI insulating film 3 on the side of the $n^+$ type semiconductor region DR for drain makes it possible to prevent an opening failure of the drain contact hole CTD and thereby prevent a coupling failure between the drain plug PGD and the $n^+$ type semiconductor region DR for drain. Therefore, the semiconductor device thus obtained can have improved reliability. In addition, the semiconductor device can be manufactured at an improved production yield. Further, placing the STI insulating film 3 on the side of the $n^+$ type semiconductor region DR for drain makes it possible to reduce the plane size of the $n^+$ type semiconductor region DR for drain. As a result, the semiconductor device thus obtained has a reduced size (area).

In the present embodiment, the n type semiconductor region (the n type semiconductor region comprised of the $n^-$ type semiconductor region NF and the n type semiconductor region NW) having a lower impurity concentration than that of the $n^+$ type semiconductor region DR is provided in the semiconductor substrate SUB between the channel formation region and the $n^+$ type semiconductor region DR for drain to extend this n type semiconductor region having a lower impurity concentration below the LOCOS oxide film 2 and the STI insulating film 3. Such a structure contributes to an increase in breakdown voltage (drain breakdown voltage).

Further, the n type semiconductor region having a low impurity concentration and present between the channel formation region and the $n^+$ type semiconductor region DR for drain is comprised of the $n^-$ type semiconductor region NF and the n type semiconductor region NW. The $n^-$ type semiconductor region NF has an impurity concentration lower than that of the n type semiconductor region NW. The $n^-$ type semiconductor region NF lies on the side of the channel formation region and the $n^-$ type semiconductor region NF and the $n^+$ type semiconductor region DR have therebetween the n type semiconductor region NW. Although it is possible to omit the formation of the n type semiconductor region NW and bring the $n^+$ type semiconductor region DR into contact with the $n^-$ type semiconductor region NF, it is more preferred to insert the n type semiconductor region NW between the $n^+$ type semiconductor region DR and the $n^-$ type semiconductor region NF without omitting the n type semiconductor region NW. This makes it possible to prevent transition of a high electric field generated when the LDMOSFET is ON-state to the drain side (side of the $n^+$ type semiconductor region) and improve the on-state breakdown voltage of the LDMOSFET.

Figure 33:
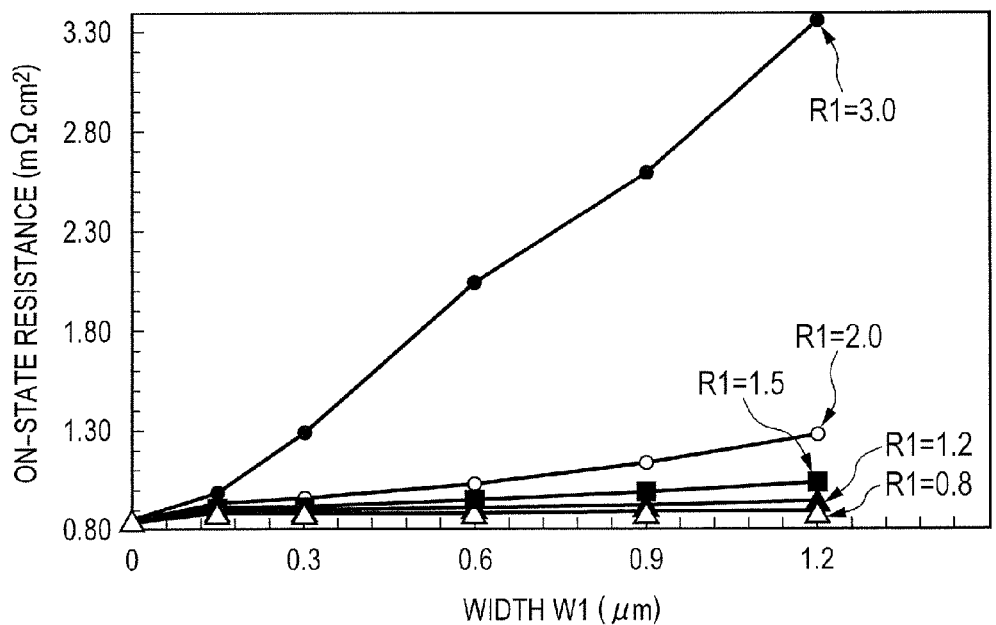
FIG. 33 is a graph showing a correlation between the width of an STI insulating film and on-state resistance.
Figure 34:
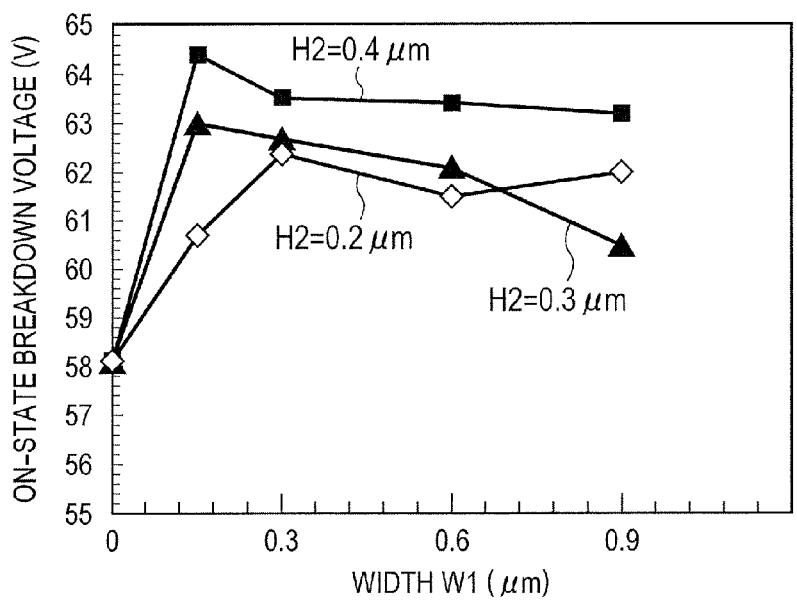
FIG. 34 is a graph showing a correlation between the width of an STI insulating film and on-state breakdown voltage.
Figure 35:
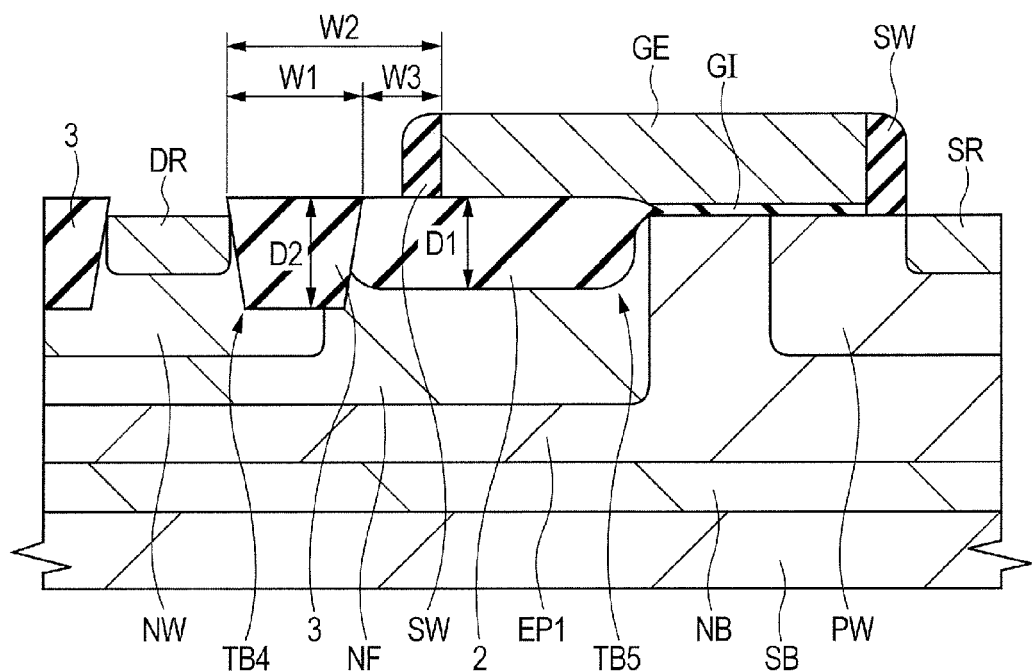
FIG. 35 is a fragmentary cross-sectional view of the semiconductor device according to the one embodiment.

FIG. 33 is a graph showing a correlation between the width W1 of the STI insulating film 3 and the on-state resistance. FIG. 34 is a graph showing a correlation between the width W1 of the STI insulating film 3 and the on-state breakdown voltage. FIG. 35 is a fragmentary cross-sectional view of the semiconductor device of the present embodiment and shows a portion of the cross-sectional view shown in FIG. 1.

The abscissa of the graph of FIGS. 33 and 34 corresponds to the width W1 of the STI insulating film 3. The width W1 of the STI insulating film 3 corresponds to the width (size) of the STI insulating film 3 in the gate length direction (therefore, the channel length direction) of the gate electrode GE and is shown in FIG. 35. The ordinate of the graph of FIG. 33 corresponds to the on-state resistance of the LDMOSFET and the ordinate of the graph of FIG. 34 corresponds to the on-state breakdown voltage of the LDMOSFET. The on-state breakdown voltage corresponds to the drain breakdown voltage when the LDMOSFET is turned ON. FIGS. 33 and 34 are graphs obtained by simulation based on the structure of FIG. 35.

The graph of FIG. 33 shows the results of studying a correlation between the width W1 of the STI insulating film 3 and the on-state resistance while changing a ratio R1 of a depth D2 of the STI insulating film 3 to a depth D1 of the LOCOS insulating film 2. A correlation between the depth ratio R1 and the on-state resistance can also be understood with reference to the graph of FIG. 33. The depth ratio R1 is obtained by dividing the depth D2 of the STI insulating film 3 by the depth D1 of the LOCOS oxide film 2 and can be expressed by R1=D2/D1. The depth D1 of the LOCOS oxide film 2 and the depth D2 of the STI insulating film 3 are shown in FIG. 35. The dimension (distance) of the LOCOS oxide film 2 from the upper surface to the lower surface thereof corresponds to the depth D1 of the LOCOS oxide film 2 and the dimension (distance) of the STI insulating film 3 from the upper surface to the lower surface thereof corresponds to the depth D2 of the STI insulating film 3.

As is apparent from the graph of FIG. 33, when the depth D2 of the STI insulating film 3 is made greater than the depth D1 of the LOCOS oxide film 2, a conduction path between the n$^+$ type semiconductor region DR for drain and the channel formation region becomes longer and thereby the on-state resistance increases. Therefore, the depth D2 of the STI insulating film 3 is preferably not made much greater than the depth D1 of the LOCOS oxide film 2. This means that an excessive increase in the depth ratio R1 is not desired. Described specifically, as can be seen from the graph of FIG. 33, the depth ratio R1 is set preferably at 1.5 or less (R1≤1.5). This means that the depth D2 of the STI insulating film 3 is preferably set at 1.5 times or less (D2≤D1×1.5) the depth D1 of the LOCOS oxide film 2. In other words, the depth D2 of the STI insulating film 3 placed between the channel formation region and the n$^+$ type semiconductor region DR for drain and the depth D1 of the LOCOS oxide film 2 placed between the channel formation region and the n$^+$ type semiconductor region DR for drain preferably satisfy the following relationship: D2/D1≤1.5. By setting the depth ratio as described above, the on-state resistance can be suppressed and therefore the semiconductor device thus obtained can have more improved performances.

The graph of FIG. 34 shows the results of studying a correlation between the width W1 of the STI insulating film 3 and the on-state breakdown voltage, while changing the depth D2 of the STI insulating film 3. The simulation in the graph of FIG. 34 is based on the premise that the distance W2 of the STI insulating film 3 from the end portion on the side of the n$^+$ type semiconductor region DR for drain to the end portion of the gate electrode GE is fixed at 0.6 μm; and the depth D1 of the LOCOS oxide film 2 is fixed at 0.25 μm. When the width on the abscissa of the graph of FIG. 34 is 0.6 μm, the end portion of the gate electrode GE substantially coincides with the end portion of the STI insulating film 3 perpendicularly. When the width on the abscissa of the graph of FIG. 34 exceeds 0.6 μm, the STI insulating film 3 overlaps with the gate electrode GE in plan view. When the width on the abscissa of the graph of FIG. 34 is 0.3 μm, it means that a distance W3 between the end portion of the STI insulating film 3 on the side of the channel formation region and the end portion of the gate electrode GE is 0.3 μm. When the width on the abscissa of the graph of FIG. 34 is 0 μm, it means that the STI insulating film 3 is not formed, in other words, it corresponds to the second study example (FIGS. 31 and 32).

As is also apparent from the graph of FIG. 34, the on-state breakdown voltage (on-state drain breakdown voltage) can be improved by placing the STI insulating film 3 on the side of the n$^+$ type semiconductor region DR for drain. This can clearly be seen from the graph of FIG. 34 in which the on-state breakdown voltage is low at the width of 0 μm on the abscissa (corresponding to the second study example having no STI insulating film 3).

As is apparent from the graph of FIG. 34, the on-state breakdown voltage increases when a certain width is secured as the width W1 of the STI insulating film 3. The on-state breakdown voltage however shows a slightly decreasing tendency when the width W1 of the STI insulating film 3 is excessively increased and the end portion of the STI insulating film 3 gets too close to the end portion of the gate electrode GE or the STI insulating film 3 overlaps with the gate electrode GE. In the graph of FIG. 34, such a tendency corresponds to a gradual decrease of the on-state breakdown voltage after showing a peak. In plan view, it is therefore preferred to prevent the STI insulating film 3 from overlapping with the gate electrode GE and it is more preferred to separate the end portion (end portion on the side of the channel formation region) of the STI insulating film 3 from the end portion (end portion on the side of the n$^+$ type semiconductor region DR for drain) of the gate electrode GE by 0.3 μm or more. In other words, it is more preferred to secure 0.3 μm or more as a space (distance) W3 between the end portion (end portion on the side of the channel formation region) of the STI insulating film 3 and the end portion (end portion on the side of the n$^+$ type semiconductor region DR for drain) of the gate electrode GE (in short, W3≥0.3 μm). This leads to precise improvement in the on-state breakdown voltage (on-state drain breakdown voltage).

It is therefore preferred to prevent the gate electrode GE from lying on the STI insulating film 3 placed between the channel formation region and the n$^+$ type semiconductor region DR for drain, though the gate electrode lies on the LOCOS oxide film 2 placed between the channel formation region and the n$^+$ type semiconductor region DR for drain. Further, it is more preferred that the end portion of the gate electrode GE is separated, by 0.3 μm or more, from the STI insulating film 3 placed between the channel formation region and the n$^+$ type semiconductor region DR for drain. This makes it possible to improve the on-state breakdown voltage more precisely. As a result, the semiconductor device thus obtained can have more improved performances.

<Modification Example>

Figure 36:
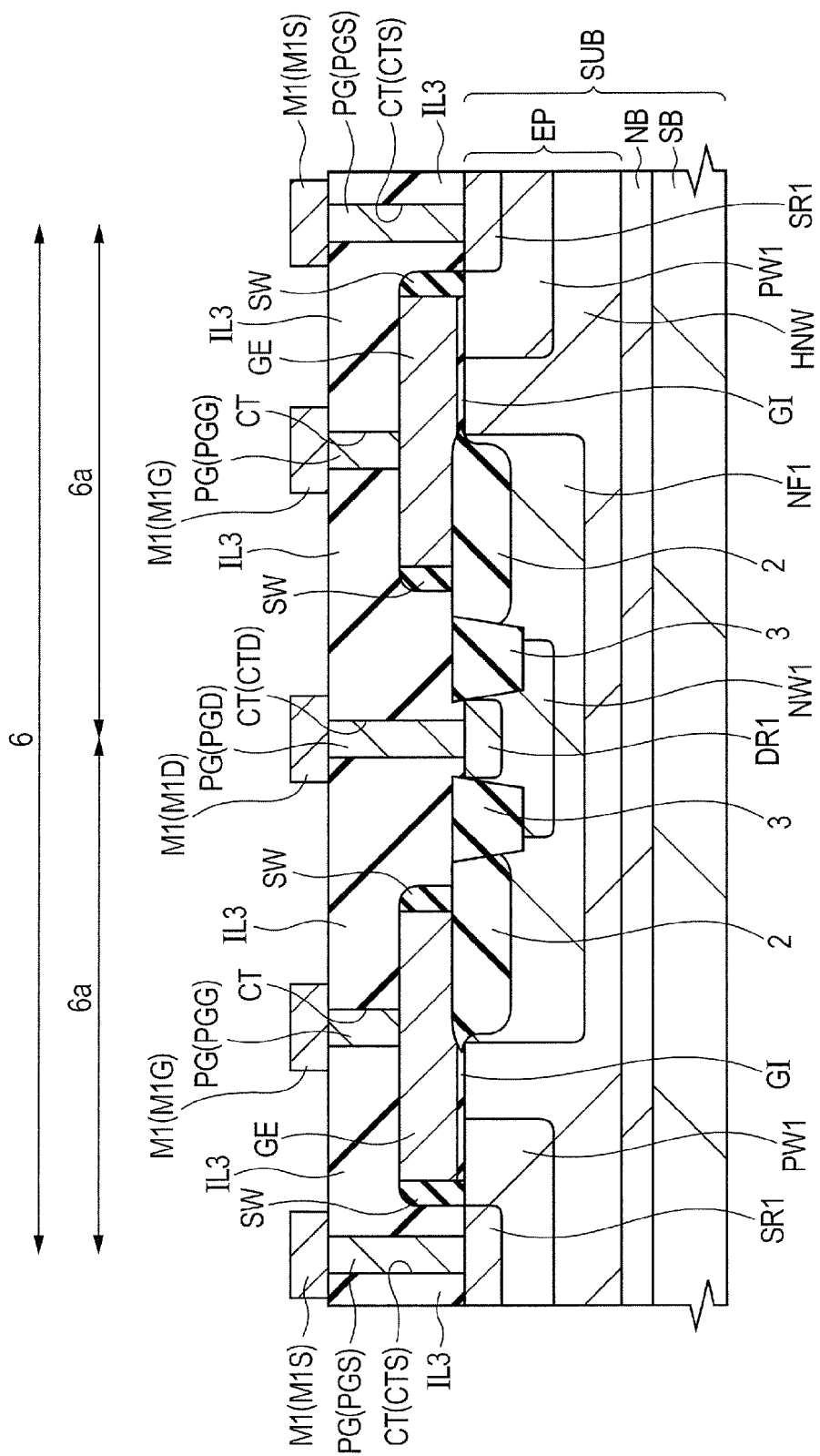
FIG. 36 is a fragmentary cross-sectional view of a semiconductor device according to a modification example.
Figure 37:
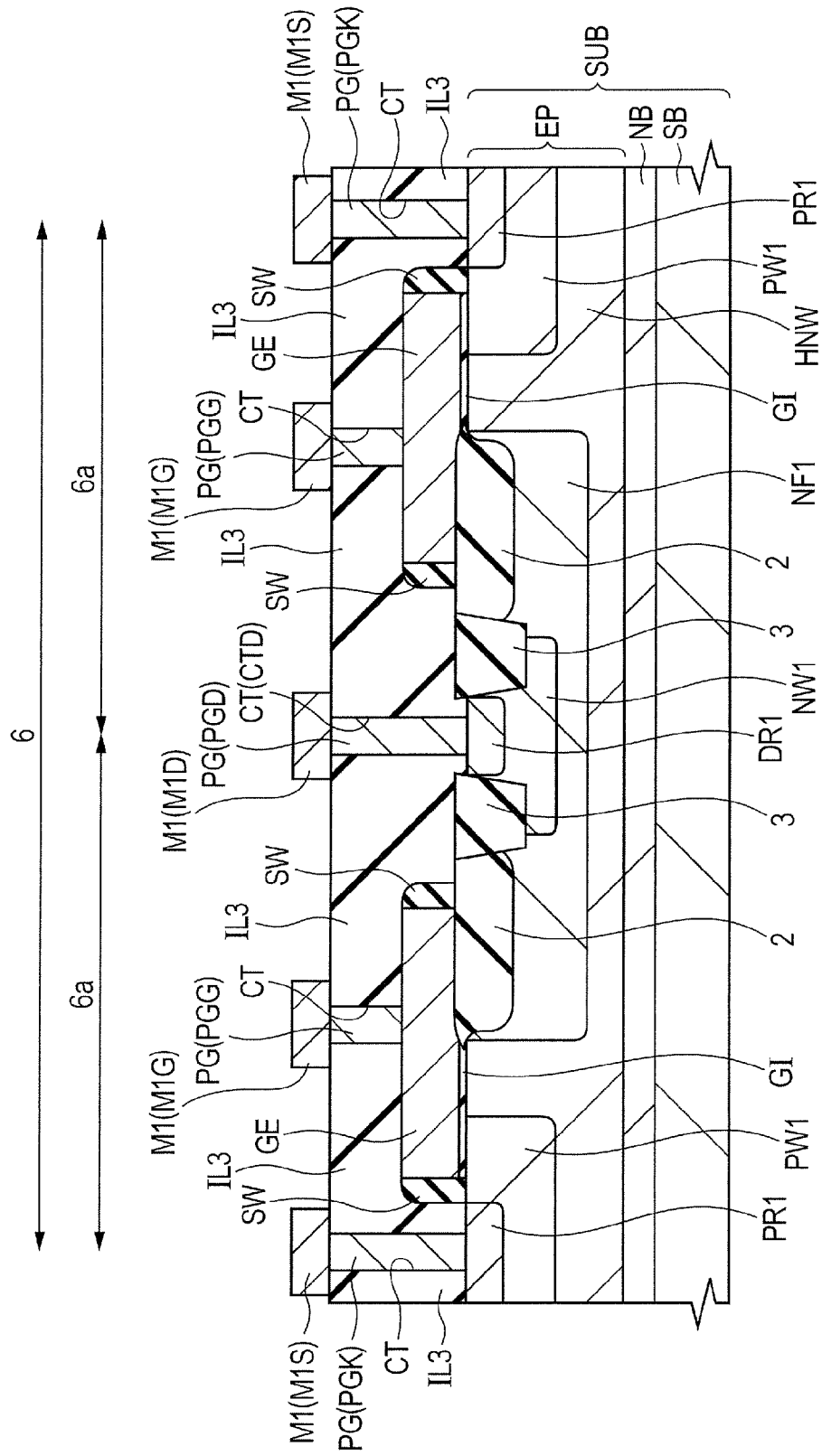
FIG. 37 is a fragmentary cross-sectional view of the semiconductor device according to the modification example.

FIGS. 36 and 37 are fragmentary cross-sectional views of a semiconductor device according to a modification example of the present embodiment. FIG. 36 is a cross-sectional view corresponding to FIG. 1 and FIG. 37 is a cross-sectional view corresponding to FIG. 2.

The LDMOSFET described above in FIBS. 1 to 4 is an n channel type. The LDMOSFET may be a p channel type and in FIGS. 37 and 38, a p-channel type LDMOSFET is shown.

More specifically, as shown in FIGS. 36 and 37, a semiconductor substrate SUB has, in an epitaxial layer EP thereof, an n type well HNW and it has, in the n type well HNW, an n type well PW1 having an impurity concentration higher than that of the n type well HNW, a p$^-$ type semiconductor region NF1 for drain, a p type semiconductor region NW1, and a p$^+$ type semiconductor region DR1. The n type well PW1 has therein a p$^+$ type semiconductor region SR1 for source and a power supplying n$^+$ type semiconductor region PR1.

The n type well PW1 is provided instead of the p type well PW and is similar to the p type well PW except that it has an opposite conductivity type. The p$^-$ type semiconductor region NF1 for drain is provided instead of the n$^-$ type semiconductor region NF for drain and is similar to the n$^-$ type semiconductor region NF except that it has an opposite conductivity type. The p type semiconductor region NW1 for drain is provided instead of the n type semiconductor region NW for drain and is similar to the n type semiconductor region NW except that it has an opposite conductivity type. The p$^+$ type semiconductor region DR1 for drain is provided instead of the n$^+$ type semiconductor region DR for drain and is similar to the n$^+$ type semiconductor region DR except that it has an opposite conductivity type. The p$^+$ type semiconductor region SR1 for source is provided instead of the n$^+$ type semiconductor region SR for source and it is similar to the n$^+$ type semiconductor region SR except that it has an opposite conductivity type. The n$^+$ type semiconductor region PR1 for supplying power to the n type well PW1 is provided instead of the p+ type semiconductor region PR for supplying power to the p type well PW and is similar to the p+ type semiconductor region PR except that it has an opposite conductivity type.

Another configuration of the semiconductor device of the modification example shown in FIGS. 36 and 37 is essentially similar to that of the semiconductor device shown in FIGS. 1 to 4 so that an overlapping description will be omitted here. The semiconductor device of the modification example shown in FIGS. 36 and 37 has, similar to the semiconductor device shown in FIGS. 1 to 4, an insulating film GI as gate insulating film, a gate electrode GE, a LOCOS oxide film 2, an STI insulating film 3, a sidewall spacer SW, an insulating film IL3, a contact hole CT, plugs PG (PGD, PGK, PGG, and PGS), and wirings M1 (M1D, M1G, and M1S). The configuration of them is also not different between the semiconductor device of the modification example shown in FIGS. 36 and 37 and the semiconductor device shown in FIGS. 1 to 4.

Even if the LDMOSFET is a p channel type as shown in FIGS. 36 and 37, it has almost similar advantages to those of the n channel type LDMOSFET as shown in FIGS. 1 to 4.

The invention made by the present inventors has been described specifically based on embodiments of them. The invention is however not limited to these embodiments and needless to say, it can be modified in various ways without departing from the gist of the invention.

What is claimed is:

1. A semiconductor device, comprising:
   a semiconductor substrate;
   a first semiconductor region for a source having a first conductivity type and a second semiconductor region for a drain having the first conductivity type formed in a surface layer portion of the semiconductor substrate while being separated from each other;
   a gate electrode formed, via a gate insulating film, over a main surface of the semiconductor substrate between the first semiconductor region and the second semiconductor region; and
   a local oxidation of silicon (LOCOS) oxide film and a shallow trench isolation (STI) insulating film formed in the main surface of the semiconductor substrate between a channel formation region below the gate electrode and the second semiconductor region,
   wherein of the LOCOS oxide film and the STI insulating film, the LOCOS oxide film is located on the side of the channel formation region and the STI insulating film is located on the side of the second semiconductor region, and the LOCOS oxide film and the STI insulating film are adjacent to each other,
   wherein the STI insulating film is located in a trench which is adjacent to the LOCOS oxide film and formed in the main surface of the semiconductor substrate,
   wherein the STI insulating film has a depth greater than a depth of the LOCOS oxide film in a cross-sectional view of the semiconductor device, and
   wherein the STI Insulating film completely surrounds the second semiconductor region for the drain and the LOCOS oxide film surrounds the STI insulating film in a plan view of the semiconductor device.

2. The semiconductor device according to claim 1, wherein a portion of the gate electrode lies over the LOCOS oxide film.

3. The semiconductor device according to claim 1, further comprising a third semiconductor region having the first conductivity type and formed in the semiconductor substrate between the channel formation region and the second semiconductor region,
   wherein the third semiconductor region has an impurity concentration lower than that of the second semiconductor region, and
   wherein the third semiconductor region extends below the LOCOS oxide film and the STI insulating film.

4. The semiconductor device according to claim 3,
   wherein the third semiconductor region has a fourth semiconductor region having the first conductivity type and a fifth semiconductor region having the first conductivity type,
   wherein the fourth semiconductor region has an impurity concentration lower than that of the second semiconductor region,
   wherein the fifth semiconductor region has an impurity concentration lower than that of the fourth semiconductor region,
   wherein the fifth semiconductor region is present on the side of the channel formation region, and
   wherein the second semiconductor region and the fifth semiconductor region have therebetween the fourth semiconductor region.

5. The semiconductor device according to claim 1, further comprising a third semiconductor region formed in the semiconductor substrate and having a second conductivity type opposite to the first conductivity type,
   wherein the first semiconductor region is formed in the third semiconductor region, and
   wherein a portion of the gate electrode extends over the third semiconductor region via the gate insulating film.

6. The semiconductor device according to claim 5, further comprising a fourth semiconductor region formed in the third semiconductor region of the semiconductor substrate and having the second conductivity type,
   wherein the fourth semiconductor region has an impurity concentration higher than that of the third semiconductor region, and
   wherein the first semiconductor region and the fourth semiconductor region are supplied with the same potential.

7. The semiconductor device according to claim 1, further comprising:
   an interlayer insulating film formed over the semiconductor substrate so as to cover the gate electrode;
   a first contact hole formed in the interlayer insulating film over the second semiconductor region; and
   a conductive first plug buried in the first contact hole and electrically coupled to the second semiconductor region.

8. The semiconductor device according to claim 7, further comprising:
   a second contact hole formed in the interlayer insulating film over the first semiconductor region; and
   a conductive second plug buried in the second contact hole and electrically coupled to the first semiconductor region.

9. The semiconductor device according to claim 1, capable of satisfying the following formula:

$$D2/D1 \leq 1.5$$

wherein D1 represents the depth of the LOCOS oxide film and D2 represents the depth of the STI insulating film.

10. The semiconductor device according to claim 1, wherein the gate electrode lies over the LOCOS oxide film placed between the channel formation region and the second semiconductor region but does not lie over the STI insulating film placed between the channel formation region and the second semiconductor region.

11. The semiconductor device according to claim 10, wherein an end portion of the gate electrode is separated, by 0.3 μm or more, from the STI insulating film placed between the channel formation region and the second semiconductor region.

* * * * *